US008405909B2

(12) United States Patent
Tanaka

(10) Patent No.: US 8,405,909 B2
(45) Date of Patent: Mar. 26, 2013

(54) DEPOSITION DONOR SUBSTRATE AND DEPOSITION METHOD USING THE SAME

(75) Inventor: Koichiro Tanaka, Kanagawa (JP)

(73) Assignee: Semiconductor Energy Laboratories Co., Ltd., Atsugi-shi, Kanagawa-ken (JP)

( * ) Notice: Subject to any disclaimer, the term of this patent is extended or adjusted under 35 U.S.C. 154(b) by 610 days.

(21) Appl. No.: 12/431,264

(22) Filed: Apr. 28, 2009

(65) Prior Publication Data

US 2009/0279179 A1 Nov. 12, 2009

(30) Foreign Application Priority Data

May 9, 2008 (JP) ................................. 2008-123204

(51) Int. Cl.
G02B 27/10 (2006.01)
(52) U.S. Cl. ........................................ 359/618; 359/619
(58) Field of Classification Search .................. 359/619, 359/618
See application file for complete search history.

(56) References Cited

U.S. PATENT DOCUMENTS

| | | | |
|---|---|---|---|
| 6,284,307 B1 | 9/2001 | Fukuzawa et al. | |
| 6,650,464 B2 | 11/2003 | Akai | |
| 2002/0098614 A1 | 7/2002 | Akai | |
| 2005/0136344 A1 | 6/2005 | Kang et al. | |
| 2006/0209165 A1* | 9/2006 | Ohkubo | 347/224 |
| 2007/0057264 A1 | 3/2007 | Matsuda | |
| 2007/0267629 A1 | 11/2007 | Kwak et al. | |
| 2007/0267953 A1 | 11/2007 | Seki | |
| 2008/0026543 A1* | 1/2008 | Miyairi et al. | 438/455 |
| 2008/0113292 A1 | 5/2008 | Matsuo | |
| 2008/0268135 A1 | 10/2008 | Yokoyama et al. | |

FOREIGN PATENT DOCUMENTS

| | | |
|---|---|---|
| EP | 1 548 857 A1 | 6/2005 |
| JP | 2000-012216 A | 1/2000 |
| JP | 2002-222694 | 8/2002 |
| JP | 2004103406 A | 4/2004 |
| JP | 2005-183381 A | 7/2005 |
| JP | 2006-244729 A | 9/2006 |
| JP | 2007141702 A | 6/2007 |
| JP | 2008-053698 | 3/2008 |

OTHER PUBLICATIONS

Urabe.T et al., '13.1:Invited Paper: Technological Evolution for Large Screen Size Active Matrix OLED Display,' SID Digest '07 : SID International Symposium Digest of Technical Papers, 2007, vol. 38, pp. 161-164. in English.

* cited by examiner

*Primary Examiner* — James Jones
(74) *Attorney, Agent, or Firm* — Fish & Richardson P.C.

(57) ABSTRACT

A lens array is formed on one surface of a deposition donor substrate and a light absorption layer is formed on the other surface; a material layer is formed in contact with the light absorption layer; the surface of the deposition donor substrate on which the material layer is formed and a deposition target surface of a deposition target substrate are disposed to face each other; and at least part of the light absorption layer is selectively irradiated with light from the side of the deposition donor substrate, on which the lens array is provided, to heat the material layer in a region overlapped by the region irradiated with the light in the light absorption layer, thereby performing deposition to the deposition target surface of the deposition target substrate.

16 Claims, 15 Drawing Sheets

FIG. 11A
FIG. 11C
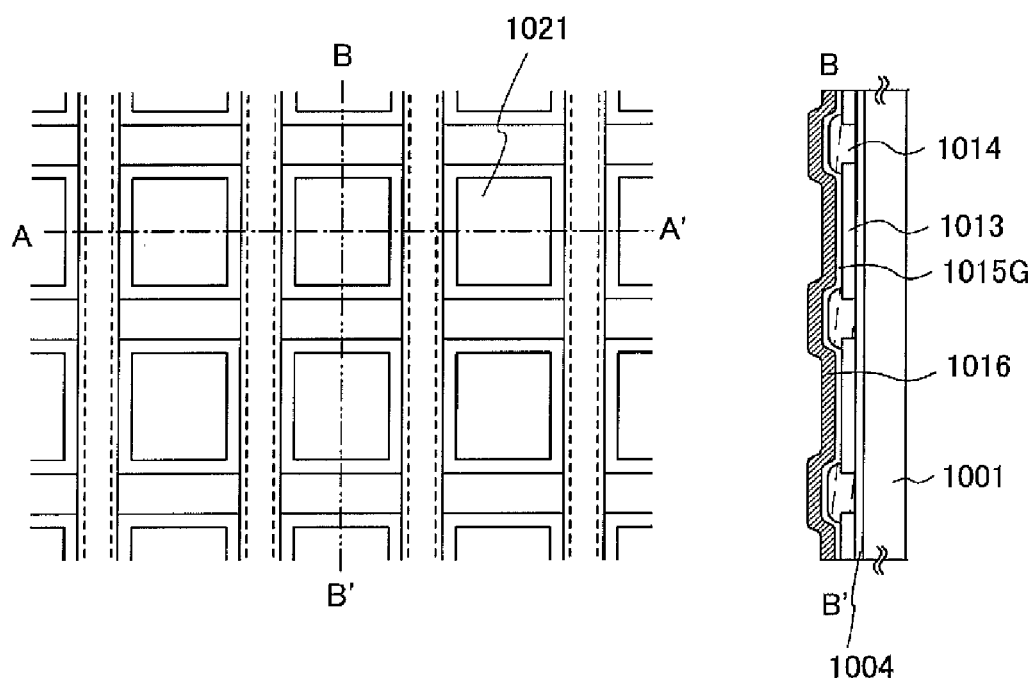
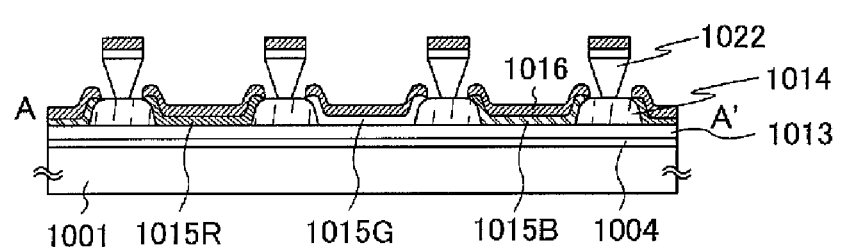
FIG. 11B

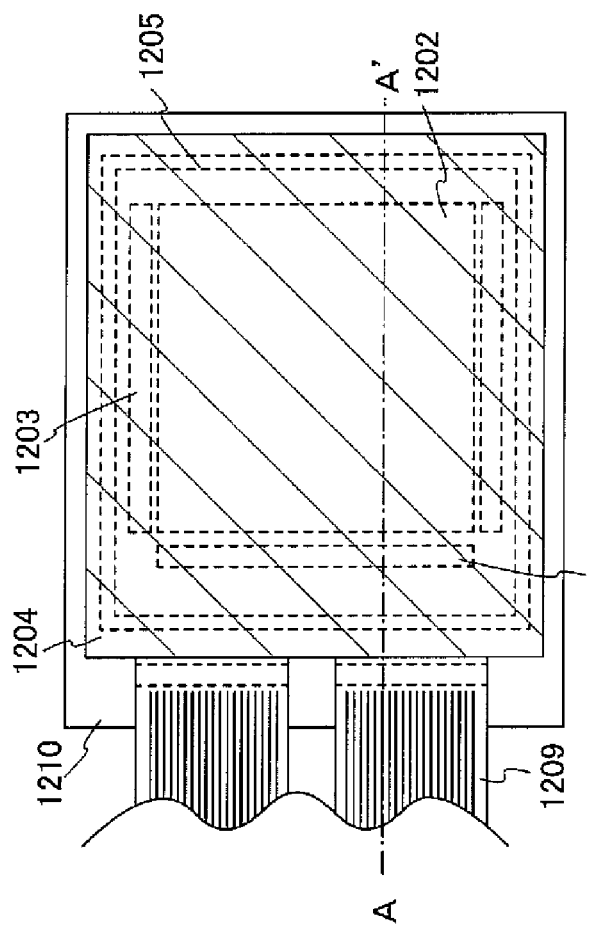
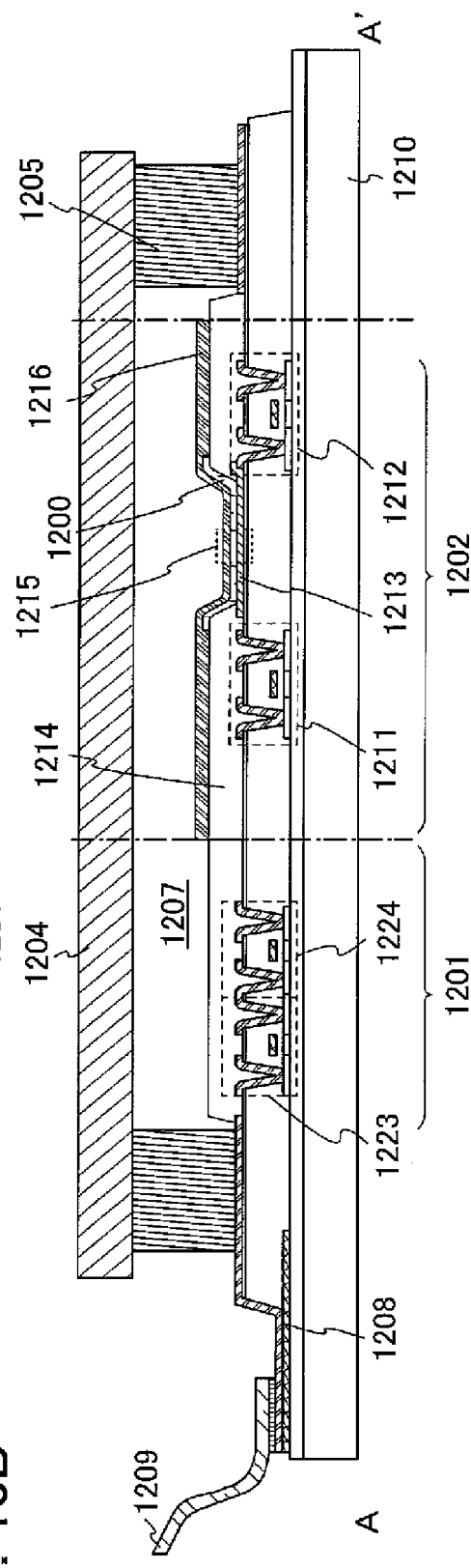
FIG. 13A
FIG. 13B

DEPOSITION DONOR SUBSTRATE AND DEPOSITION METHOD USING THE SAME

BACKGROUND OF THE INVENTION

1. Field of the Invention

The present invention relates to a deposition donor substrate which is used to form a layer including an organic compound, and to a deposition method using the substrate. The present invention also relates to a method for manufacturing a light emitting device having a layer including an organic compound as a light emitting layer.

2. Description of the Related Art

Light emitting elements including an organic compound as a luminous body, which have features such as thinness, lightness, high-speed responses, and DC drive at low voltage, are expected to be applied to next-generation flat panel displays. In particular, display devices in which light emitting elements are arranged in matrix are superior in viewing angle and visibility to conventional liquid crystal display devices.

It is said that a light emitting mechanism of a light emitting element emits light in the following manner: when voltage is applied between a pair of electrodes with an electroluminescent (hereinafter also referred to as EL) layer interposed therebetween, electrons injected from a cathode and holes injected from an anode are recombined at emission centers in the EL layer to form molecular excitons, and energy is released when the molecular excitons relax to the ground state. As excited states, a singlet excited state and a triplet excited state are known, and light emission is considered to be possible through either of the excited states.

An EL layer included in a light emitting element has at least a light emitting layer. An EL layer can also have a stacked-layer structure including a hole injecting layer, a hole transporting layer, an electron transporting layer, an electron injecting layer, and/or the like, in addition to a light emitting layer.

EL materials for forming EL layers are broadly classified into a low molecular (monomer) material and a high molecular (polymer) material. In general, a low molecular material is often deposited by an evaporation method and a high molecular material by an inkjet method, a spin coating method, or the like.

An evaporation apparatus used for an evaporation method has a substrate holder for mounting a substrate thereon, a crucible (or an evaporation boat) containing an EL material, i.e., an evaporation material, a heater for heating the EL material in the crucible, and a shutter for preventing a subliming EL material from being scattered. The EL material heated with the heater is sublimed and deposited onto the substrate. In order to achieve uniform deposition, a deposition target substrate needs to be rotated and the distance between the substrate and the crucible needs to be about 1 m even when the substrate has a size of 300 nm×360 mm. Thus, when the size of a substrate to be processed is increased, the size of an evaporation apparatus also needs to be increased more than that. Therefore, the size of a substrate onto which a film can be deposited by an evaporation method is practically limited.

When the evaporation method mentioned above is employed to manufacture a full-color display device with red, green, and blue light emitting elements, a shadow mask is provided in contact with a substrate between the substrate and an evaporation source and selective deposition for each color can be achieved through this mask.

However, a shadow mask which is used to manufacture a full-color display device is very thin because of the necessity for precise manufacture of its opening portion. Thus, if the size of a shadow mask is increased as the size of a substrate is increased, problems may arise in that a shadow mask bends and the size of an opening portion is changed. It is difficult to adopt a means for reinforcing a shadow mask in a region of the shadow mask corresponding to a pixel portion. Thus, in the case of manufacturing a large-area display region, it is also difficult to employ a reinforcing means.

Furthermore, miniaturization of each display pixel pitch is increasingly demanded with an increase in definition of a display device (with an increase in the number of pixels), and there is a trend toward even thinner shadow masks.

On the other hand, a method for directly forming an EL layer over a substrate by a wet method such as an inkjet method or a spin coating method can also be employed when the size of a substrate is increased; however, it is difficult to form a uniform film by this method. When a wet method is employed, it is necessary that a composition or a solution including an EL material is applied and then baked to remove a solvent. Thus, in the case of stacking layers including an EL material, an application step and a baking step need to be repeated, and it takes a very long time. In the case of stacking layers by a wet method such as an inkjet method, a layer has to be formed using a solvent in which a previously formed layer is not soluble, and there is only a limited choice of materials and stacked-layer structures to be used. If there is only a limited choice of materials or stacked-layer structures to be used, there is a significant limitation on the performance of a light emitting element (such as luminous efficiency or lifetime). Thus, a wet method may become a major obstacle to improvement in the performance of a light emitting device; for example, it may prevent the application of even a light emitting element with an excellent structure to a light emitting device.

Thus, a method for forming an EL layer of a light emitting element by laser thermal transfer has been proposed. Reference 1, for example, discloses a method for manufacturing an EL display panel, in which laser light passing through a slit is delivered to a donor substrate through a lens and an organic thin film layer provided over the donor substrate is transferred to a substrate.

[Reference 1] Japanese Published Patent Application No. 2002-222694

SUMMARY OF THE INVENTION

However, when an EL layer is formed by the deposition method disclosed in Reference 1, light focused through a lens is delivered to a donor substrate. Thus, in order to form a fine EL layer, necessity arises to align the lens with the donor substrate in a plane direction and a perpendicular direction with high accuracy. In addition, a single beam spot is formed with a lens, and an entire surface of a donor substrate is irradiated with the single beam spot. Thus, there is a problem in that it takes a long time to manufacture a display region particularly when manufacturing a large-area display region.

Thus, it is an object of an embodiment of the present invention to provide a deposition donor substrate and a method for manufacturing a light emitting device which can advance miniaturization of each display pixel pitch with an increase in definition (an increase in the number of pixels) and a decrease in size of a light emitting device. It is also an object of an embodiment of the present invention to shorten the time it takes to manufacture a light emitting device (the cycle time), and to improve productivity.

An embodiment of the present invention is a deposition donor substrate which includes a lens array on one surface and a light absorption layer and a material layer in contact with the light absorption layer on the other opposite surface.

In the deposition donor substrate that is an embodiment of the present invention, one or both of the light absorption layer and the material layer may be patterned in an island or stripe shape.

Another embodiment of the present invention is a deposition method which includes the steps of: forming a lens array on one surface of a deposition donor substrate and a light absorption layer on the other surface; forming a material layer in contact with the light absorption layer; disposing the surface of the deposition donor substrate on which the material layer is formed and a deposition target surface of a deposition target substrate to face each other; and selectively irradiating at least part of the light absorption layer with light from the side of the deposition donor substrate, on which the lens array is provided, to heat the material layer in a region overlapped by the region irradiated with the light in the light absorption layer, thereby performing deposition to the deposition target surface of the deposition target substrate.

Note that the light emitting devices in this specification refer to image display devices, light emitting devices, and light sources (including lighting devices). In addition, light emitting devices include all of the following modules: modules provided with a connector, for example, a flexible printed circuit (FPC), a tape automated bonding (TAB) tape, or a tape carrier package (TCP); modules provided with a printed wiring board at the end of a TAB tape or a TCP; and modules where an integrated circuit (IC) is directly mounted by a chip-on-glass (COG) method.

Note that the terms of degrees which are used in this specification, such as "approximately," mean a reasonable amount of deviation from the modified term such that the end result is not significantly changed. These terms should be construed as including a deviation of at least ±5% of the modified term if this deviation would not negate the meaning of the word it modifies.

According to an embodiment of the present invention, a fine pattern of EL layers can be formed, and a high-definition light emitting device can be manufactured.

In addition, according to an embodiment of the present invention, the time it takes to manufacture a light emitting device (the cycle time) can be shortened, and productivity can be improved.

BRIEF DESCRIPTION OF THE DRAWINGS

FIGS. 11A to 11C are diagrams illustrating a passive-matrix light emitting device.

FIGS. 13A and 13B are diagrams illustrating an active-matrix light emitting device.

DETAILED DESCRIPTION OF THE INVENTION

Figure 1A:
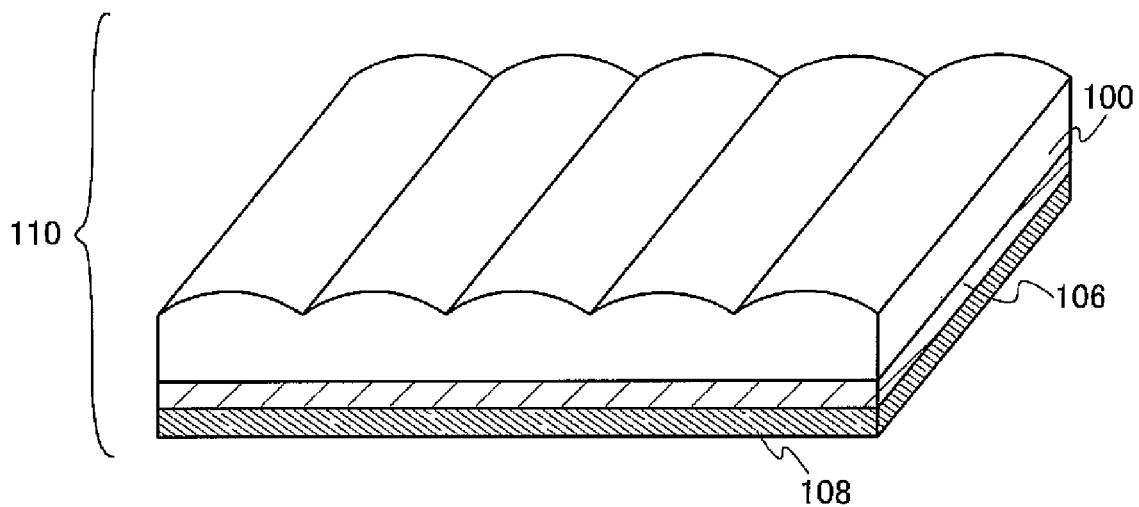
FIGS. 1A and 1B are diagrams illustrating an example of a deposition donor substrate.

Embodiments of the present invention will be described in detail with reference to the drawings. However, the present invention is not limited to the following description and the mode and detail of the present invention can be changed in various ways without departing from the spirit and scope thereof. Therefore, the present invention is not interpreted as being limited to the following description of the embodiments. Note that, in the configurations of the present invention described below, the same reference numeral may be commonly used to denote the same component in different diagrams.

(Embodiment 1)

In this embodiment, a deposition donor substrate and a method for manufacturing a light emitting device using the deposition donor substrate are described with reference to FIGS. 1A and 1B and FIGS. 2A and 2B. Note that in this specification, a substrate which is provided with a material for deposition and is used to perform deposition to a deposition target substrate is referred to as a deposition donor substrate.

Figure 1B:
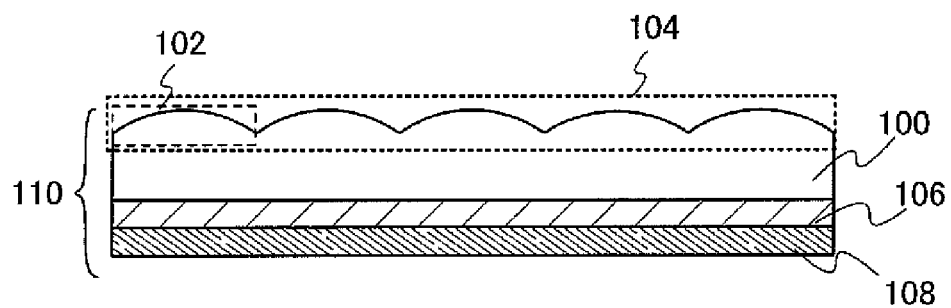

FIG 1A is a perspective view and FIG. 1B is a cross-sectional view of a deposition donor substrate 110 of this embodiment. In FIGS. 1A and 1B, on one surface of a support substrate 100, a lens array 104 including a plurality of lenses 102 is formed. As the lenses 102 included in the lens array 104, a cylindrical lens, a spherical lens with a polygonal contour, or the like may be used. Alternatively, a spherical lens with a circular or elliptical contour may be used. Note that the lens array 104 in this embodiment is formed on approximately an entire surface of the support substrate. As the distance between lenses included in a lens array becomes smaller, the support substrate 100 can receive more light. Thus, in order to effectively utilize irradiation light in a later step, the plurality of lenses 102 is preferably arranged on the support substrate 100 with high density.

The support substrate 100 is a supporting substrate for a light absorption layer 106 and a material layer 108 and transmits irradiation light for heating the material layer 108 in a manufacturing process of a light emitting device. Therefore, it is preferable that the support substrate 100 have high light transmittance. Specifically, it is preferable that a substrate which transmits irradiation light for evaporating the material layer 108 be used as the support substrate 100. It is also preferable that the support substrate 100 be formed from a material having low thermal conductivity. With the use of a material having low thermal conductivity, heat obtained from irradiation light can be efficiently used for deposition in a deposition step of an EL layer. As the support substrate 100, for example, a glass substrate, a quartz substrate, or the like can be used. To a glass substrate, a quartz substrate, or the like, an impurity (such as moisture) is less likely to be adsorbed or attached than to a film substrate or the like. Thus, the incorporation of impurities can be prevented during deposition.

The lens array 104 can be manufactured by processing of the support substrate 100 with an electron beam, a laser beam, or the like. Alternatively, the support substrate 100 may be processed by etching. The lens array 104 is a plurality of convex lenses 102 which are arranged in an array and functions to focus light passing through each lens 102 and selectively project the light onto a certain region of the light absorption layer. The size of a region of the light absorption layer 106 irradiated with light through the lens array 104 can be appropriately changed by changing the material and thickness of the support substrate 100, the radius of curvature of the lens 102, or the like. Light focused through the lens array 104 is absorbed by the light absorption layer 106, and the material layer 108 in a region overlapped by the irradiated region of the light absorption layer 106 is heated. Thus, the lens array 104 is preferably provided such that a region irradiated with light in the light absorption layer 106 have approximately the same size as a pixel to be formed over a deposition target substrate or have approximately the same width as a pixel to be formed over a deposition target substrate.

For example, in the case where BK7 is used as a material of the lens array 104, where the support substrate 100 has a thickness of 0.7 mm, and where the lens 102 has a radius of curvature of 0.16 mm, the light absorption layer 106 can be irradiated with a beam spot having a width of 20 $\mu$m when irradiated from the side on which the lens array 104 is provided.

Note that in the case of manufacturing a deposition target substrate for full-color display, one lens 102 is preferably provided for every three pixels of a plurality of pixels to be formed over the deposition target substrate. With the use of three such deposition donor substrates, material layers of the deposition donor substrates can be transferred to all of the plurality of pixel regions over the deposition target substrate. In the case of manufacturing a deposition target substrate for monochromatic display, when EL layers of, for example, an island shape are to be deposited, one lens 102 is preferably provided for each of the plurality of pixels to be formed over a deposition target substrate, and when EL layers of a stripe shape are to be deposited, one lens 102 is preferably provided for each pixel column. The size of the lens 102 is appropriately determined depending on the pixel pitch of the deposition target substrate.

In this embodiment, a case is described as an example, in which a deposition target substrate is manufactured for monochromatic display by using a deposition donor substrate where one lens is provided for each pixel column.

The surface of the support substrate 100 opposite to the surface on which the lens array 104 is provided is a flat surface, on which the light absorption layer 106 is formed. In addition, the material layer 108 is formed in contact with the light absorption layer 106. In FIGS. 1A and 1B, the material layer 108 is formed to cover an entire surface of the support substrate 100.

The light absorption layer 106 absorbs irradiation light for heating the material layer 108 and converts the light into heat in the process of manufacturing a light emitting device. It is preferable that the light absorption layer 106 be formed from a material having a reflectance of 70% or less for irradiation light and having high absorptance. It is also preferable that the light absorption layer 106 be formed from a material having excellent heat resistance so that it does not change with heat. The light absorption layer 106 is not limited to a single layer and may include a plurality of layers.

The kind of material suitable for the light absorption layer 106 varies depending on the wavelength of irradiation light for heating the material layer. For example, for light having a wavelength of 800 nm, molybdenum, tantalum nitride, titanium, tungsten, or the like is preferably used. For light having a wavelength of 1300 nm, tantalum nitride, titanium, or the like is preferably used.

Note that a molybdenum film and a tungsten film, which have a reflectance of 60% or less for light having a wavelength of 800 nm to 900 nm when having, for example, a thickness of 400 nm, can be suitable for use as a light absorption layer.

The light absorption layer 106 can be formed by any of various methods. For example, the light absorption layer 106 can be formed by a sputtering method using a target of molybdenum, tantalum, titanium, tungsten, an alloy thereof, or the like. In addition, the light absorption layer is not limited to a single layer and may include a plurality of layers.

It is preferable that the light absorption layer have a thickness such that it does not transmit irradiation light. It is preferable that the thickness be in the range from 100 nm to 2 $\mu$m although it depends on a material. In particular, the light absorption layer 106 having a thickness of 200 nm to 600 nm can efficiently absorb irradiation light to generate heat.

Note that the light absorption layer 106 may transmit part of irradiation light as long as an evaporation material included in the material layer 108 is heated to an evaporation temperature (at which the evaporation material is moved to the deposition target substrate). When the light absorption layer transmits part of irradiation light, it is preferable that a material which does not decompose when irradiated with light be used for the material layer 108.

The material layer 108 includes a material of an EL layer to be deposited on a deposition target substrate. There are various kinds of materials as an EL layer deposition material included in the material layer. The material layer 108 may include plural kinds of materials. In addition, the material layer 108 may be a single layer or a plurality of stacked layers. Note that it is preferable that when a plurality of material layers is stacked, these layers are stacked so as to include an evaporation material having lower decomposition temperature on the support substrate 100 side. Alternatively, it is preferable that a plurality of material layers be stacked so as to include an evaporation material having lower evaporation temperature on the support substrate 100 side. Such a structure enables efficient evaporation of a plurality of material layers including evaporation materials. When a plurality of material layers is stacked, co-evaporation is possible. Note that the term "evaporation temperature" in this specification refers to a temperature at which an EL layer deposition material included in a material layer is moved to a deposition target substrate. The term "decomposition temperature" refers to a temperature at which a change occurs by the action of heat in at least part of a chemical formula that represents a material.

The material layer 108 is formed by any of various methods. For example, a dry method such as a vacuum evaporation method or a sputtering method can be used. Alternatively, a wet method such as a spin coating method, a spray coating method, an inkjet method, a dip coating method, a casting method, a die coating method, a roll coating method, a blade coating method, a bar coating method, a gravure coating method, or a printing method can be used. In order to form the material layer 108 by a wet method, a desired evaporation material may be dissolved or dispersed in a solvent and the solution or the dispersion may be adjusted. There is no particular limitation on the solvent as long as an evaporation material can be dissolved or dispersed therein and the solvent does not react with the evaporation material. Examples of the solvent are as follows: halogen-based solvents such as chloroform, tetrachloromethane, dichloromethane, 1,2-dichloroethane, and chlorobenzene; ketone-based solvents such as acetone, methyl ethyl ketone, diethyl ketone, n-propyl methyl ketone, and cyclohexanone; aromatic solvents such as benzene, toluene, and xylene; ester-based solvents such as ethyl acetate, n-propyl acetate, n-butyl acetate, ethyl propionate, γ-butyrolactone, and diethyl carbonate; ether-based solvents such as tetrahydrofuran and dioxane; amide-based solvents such as dimethylformamide and dimethylacetamide; dimethyl sulfoxide; hexane; water; and the like. A mixture of plural kinds of these solvents may also be used. The use of a wet method makes it possible to enhance material use efficiency and to reduce manufacturing cost of a light emitting device.

Note that the thickness and uniformity of an EL layer, which is formed over a deposition target substrate 200 in a later step, depend on the material layer 108 formed over the support substrate 100. Therefore, it is important to uniformly form the material layer 108. Note that the material layer 108 does not necessarily need to be a uniform layer if the thickness and uniformity of an EL layer can be ensured. For example, the material layer 108 may be formed in a fine island shape or may be formed in an uneven layer shape. By control of the thickness of the material layer 108, the thickness of an EL layer 207 to be formed over the deposition target substrate 200 can be easily controlled.

Note that any of various materials can be used as the evaporation materials regardless of whether it is an organic compound or an inorganic compound. In particular, many organic compounds have lower evaporation temperatures than inorganic compounds; thus, organic compounds can be easily evaporated by light irradiation and are suitable for the method for manufacturing a light emitting device of this embodiment. Examples of organic compounds include a light emitting material, a carrier transporting material, and the like which are used for an EL layer. Examples of inorganic compounds include a carrier transporting material and a carrier injecting material for an EL layer, and a metal oxide, a metal nitride, a metal halide, an elemental metal, and the like which are used for an electrode.

Figure 2A:
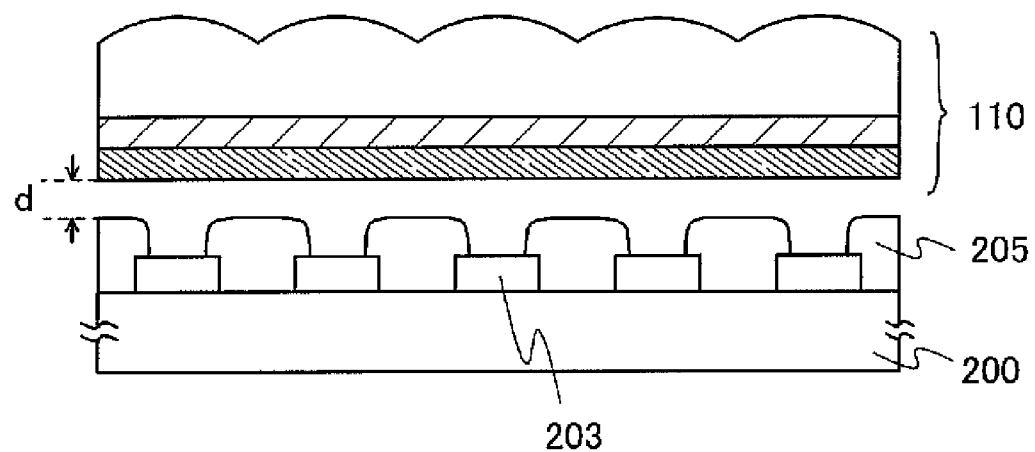
FIGS. 2A and 2B are diagrams illustrating an example of a deposition method.

Next, as illustrated in FIG. 2A, the deposition target substrate 200 is disposed to face the surface of the deposition donor substrate 110 where the light absorption layer 106 and the material layer 108 are formed. The deposition target substrate 200 is a substrate on which a desired EL layer is deposited by evaporation treatment. Then, the deposition donor substrate 110 and the deposition target substrate 200 are disposed in close proximity to each other; specifically, they are disposed close to each other such that the distance d between the surface of the material layer 108 provided on the deposition donor substrate 110 and the deposition target substrate 200 is in the range from 0 mm to 0.05 mm, preferably, 0 mm to 0.03 mm.

Note that the distance d is defined as a distance between the surface of the material layer 108 formed over the support substrate 100 and the surface of the deposition target substrate 200. In the case where some layer (such as a conductive layer which functions as an electrode or an insulating layer which functions as a partition) is formed over the deposition target substrate 200, the distance d is defined as a distance between the surface of the material layer 108 and the surface of the layer formed over the deposition target substrate. Note that in the case where the surface of the material layer 108 or the surface of the layer formed over the deposition target substrate 200 is uneven, the distance d is defined as the shortest distance between the outermost surface of the material layer 108 and the outermost surface of the deposition target substrate or the layer formed over the deposition target substrate.

When the distance d is short, material use efficiency can be improved. In addition, the accuracy in formation of a pattern of layers formed over the deposition target substrate can be improved. Note that in order to improve material use efficiency or to improve the accuracy in pattern formation, it is preferable that the distance between the deposition donor substrate 110 and the deposition target substrate 200 be shorter. However, this embodiment is not limited to this condition.

Figure 2B:
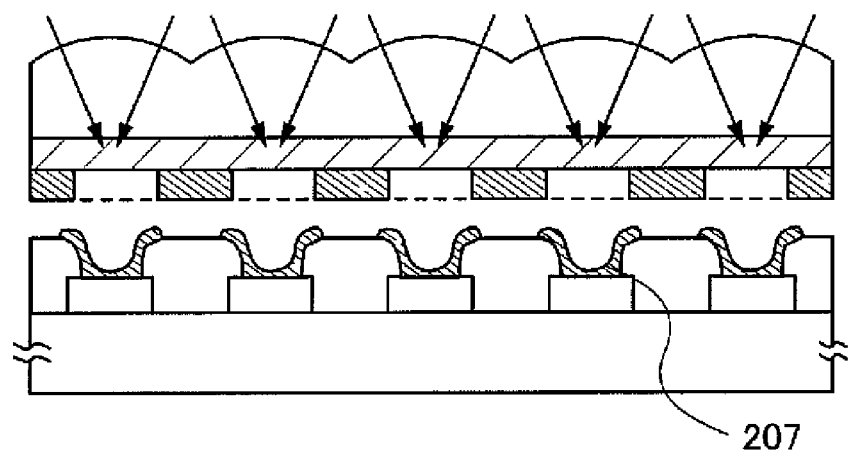

In FIGS. 2A and 2B, the deposition target substrate 200 is provided with first electrode layers 203. It is preferable that edge portions of the first electrode layers 203 be covered with an insulator 205. When the insulator 205 is provided, the material layer 108 and a pixel formation region can be prevented from being in contact with each other even in the case where the distance d is 0 mm, that is, in the case where the outermost surface of the deposition donor substrate 110 and the outermost surface of the deposition target substrate 200 are in contact with each other. In this embodiment, the first electrode layers 203 each represent an electrode which serves as an anode or a cathode of a light emitting element.

Note that in FIG. 2A, the deposition donor substrate 110 and the deposition target substrate 200 are aligned with each other such that regions of the light absorption layer 106 irradiated with light focused through the lens array 104 overlap the first electrode layers 203 over the deposition target substrate 200. It is preferable that at least one of the deposition donor substrate 110 and the deposition target substrate 200 be provided with an alignment marker. Note that in the deposition donor substrate 110, portions of the light absorption layer 106 and the material layer 108 near the alignment marker are preferably removed in advance.

Next, as illustrated in FIG. 2B, light irradiation is performed from the side of the deposition donor substrate 110 on which the lens array 104 is provided. The lens array 104 focuses light, with which at least part of the light absorption layer 106 is selectively irradiated. Light absorbed by the irradiated region of the light absorption layer 106 is converted into thermal energy, whereby the material layer 108 in a region overlapped by the irradiated region of the light absorption layer 106 is heated and sublimed. An evaporation material sublimed is attached onto the first electrode layers. Accordingly, EL layers 207 are deposited.

In this embodiment, it is preferable that the support substrate 100 and the deposition target substrate 200 be formed from the same material. When the support substrate 100 and the deposition target substrate 200 are formed from the same material, the two substrates can be made to have an equal coefficient of thermal expansion. Accordingly, even in the case where the deposition donor substrate expands due to heat when irradiated with light, the deposition target substrate also expands at the same coefficient of thermal expansion; thus, a decrease in transfer accuracy due to a difference in coefficient of thermal expansion can be suppressed. Note that the support substrate 100 and the deposition target substrate 200 do not necessarily need to be formed from the same material, and may be formed from different materials when a difference in coefficient of thermal expansion is small enough not to affect transfer accuracy.

As irradiation light, laser light can be used, for example. Examples of light sources of laser light are as follows: a gas laser such as an Ar laser, a Kr laser, or an excimer laser; a laser using, as a medium, single crystal YAC, YVO$_4$, forsterite (Mg$_2$SiO$_4$), YAlO$_3$, or GdVO$_4$, or polycrystalline (ceramic) YAQY$_2$O$_3$, YVO$_4$, YAlO$_3$, or GdVO$_4$ doped with one or more of Nd, Yb, Cr, Ti, Ho, Er, Tm, and Ta as a dopant; a glass laser; a ruby laser; an alexandrite laser; a Ti:sapphire laser; a fiber laser; a copper vapor laser; a gold vapor laser; and a combination thereof. The use of a solid-state laser that uses a solid as a laser medium or a fiber laser is advantageous in that a maintenance-free condition can be maintained for a long time and output is relatively stable. Alternatively, a flash lamp, a halogen lamp, or the like may be used as a light source.

It is preferable that the laser spot have a linear or rectangular shape. With laser light having a laser spot of a linear or rectangular shape, a process substrate can be efficiently scanned. Thus, the time it takes for deposition (the cycle time) is shortened, and productivity is improved.

There is no particular limitation on the wavelength of laser light, and laser light having various wavelengths can be used. For example, laser light having a wavelength of 355 nm, 515 nm, 532 nm, 1030 nm, 1064 nm, or the like can be used.

A feature of this embodiment is that the light absorption layer 106 which has absorbed light from a light source provides heat to the material layer 108. Thus, light irradiation time is preferably short in order to prevent heat from being conducted from a light irradiated portion of the light absorption layer 106 in a plane direction and to an undesired region of the material layer 108.

It is preferable that deposition be performed in a reduced-pressure atmosphere. The reduced-pressure atmosphere can be obtained by evacuation of a deposition chamber with a vacuum evacuation unit to a vacuum of about $5\times10^{-3}$ Pa or less, preferably, about $10^{-4}$ Pa to $10^{-6}$ Pa.

Note that FIGS. 2A and 2B illustrate the case where the deposition target substrate 200 is located below the deposition donor substrate 110. However, this embodiment is not limited to this case. The disposition of the substrates can be appropriately set.

Figure 3A:
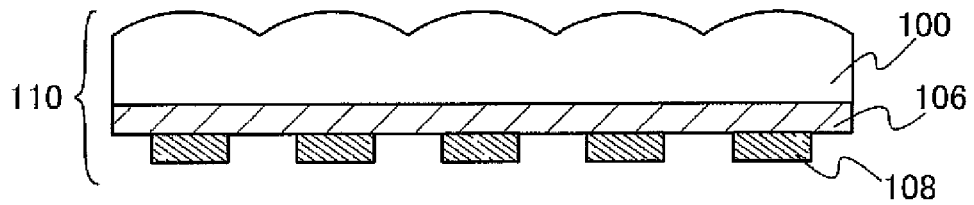
FIGS. 3A to 3D are diagrams illustrating an example of a deposition method.

This embodiment is not limited to the structure illustrated in FIGS. 1A and 1B and FIGS. 2A and 2B. For example, the light absorption layer 106 and the material layer 108 may be formed over an entire surface of the support substrate 100 and the material layer 108 may be patterned into an island or stripe shape as illustrated in FIG. 3A. By patterning of the material layer 108, even if heat conduction in a plane direction occurs in the light absorption layer irradiated with light, it becomes possible to suppress blur where deposition is also performed to a region outside a desired pattern. Note that material layers 108 of an island or stripe shape may be formed by an inkjet method or the like, not by patterning of the material layer 108 after formation over an entire surface of the support substrate 100. By selective formation of the material layers 108 to correspond to deposition target regions by an inkjet method or the like, material use efficiency can be further improved.

Figure 3B:
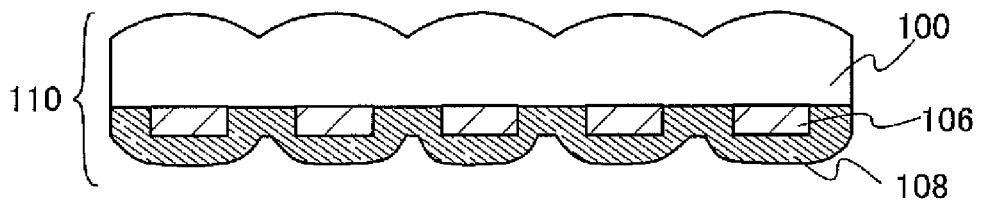

Alternatively, light absorption layers 106 patterned in an island or stripe shape may be provided over the support substrate 100, and then, the material layer 108 may be formed over the entire surface of the support substrate 100 as illustrated in FIG. 3B. In the case where the light absorption layers 106 are formed in an island or stripe shape, heat conduction in a plane direction within a light absorption layer can be prevented as compared to the case where the light absorption layer is formed over the entire surface. Accordingly, a finer pattern of EL layers can be formed, and a high-definition light emitting device can be manufactured. Note that although a variety of methods can be used to pattern the light absorption layer 106, it is preferable to employ dry etching. With the use of dry etching, the light absorption layers 106 after being patterned have a steep side wall, and a fine pattern can be deposited.

Figure 3C:
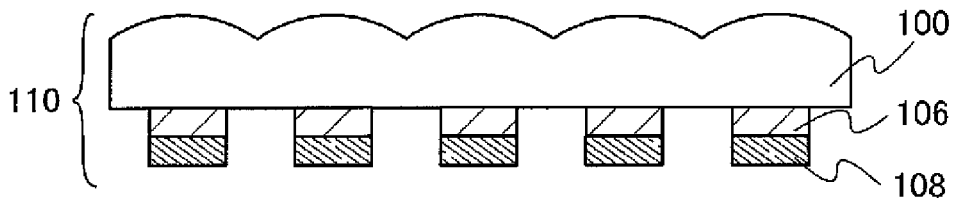

Alternatively, a structure may be employed in which light absorption layers 106 patterned in an island or stripe shape and material layers 108 patterned in an island or stripe shape in contact with the light absorption layers 106 are provided on the surface of the support substrate 100 opposite to the lens array 104 as illustrated in FIG. 3C. With the structure illustrated in FIG. 3C, it is possible to prevent heat conduction in a plane direction within a light absorption layer and to suppress blur where the material layers 108 are also deposited to a region outside a desired pattern. Accordingly, a fine pattern can be formed, and a high-definition light emitting device can be manufactured.

Figure 3D:
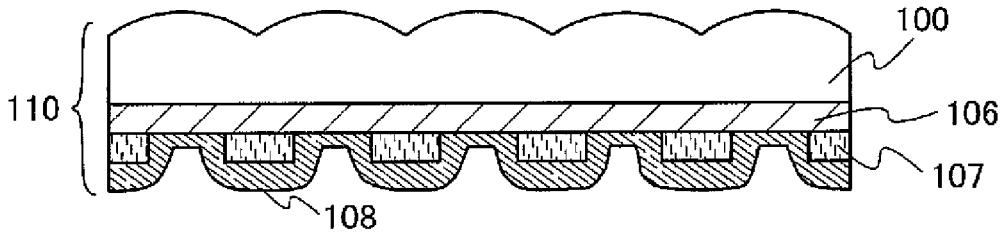

Still alternatively, a heat insulating layer 107 having openings may be formed between the light absorption layer 106 and the material layer 108 as illustrated in FIG. 3D. The openings of the heat insulating layer 107 are formed to overlap regions to be irradiated with light in the light absorption layer 106. For the heat insulating layer 107, for example, titanium oxide, silicon oxide, silicon oxynitride, zirconium oxide, titanium carbide, or the like can be preferably used. Note that the heat insulating layer 107 is formed using a material having lower thermal conductivity than the material used for the light absorption layer 106. Note that in this specification, oxynitride is a substance which contains more oxygen than nitrogen.

The heat insulating layer 107 can be formed by any of various methods. For example, the heat insulating layer 107 can be formed by a sputtering method, an electron beam evaporation method, a vacuum evaporation method, a CVD method, or the like. The thickness of the heat insulating layer can be in the range from 10 nm to 2 μm, preferably 100 nm to 600 nm, although it depends on a material. When the thickness of the heat insulating layer 107 is in the range from 10 nm to 2 μm, heat conduction in a perpendicular direction to an undesired region of the material layer can be suppressed even in the case where heat conduction in a plane direction occurs within the light absorption layer. Accordingly, a finer pattern of EL layers can be formed, and a high-definition light emitting device can be manufactured.

Note that although FIG. 3D illustrates the structure in which the light absorption layer 106 and the material layer 108 are formed over the entire surface of the support substrate, one or both of the light absorption layer 106 and the material layer 108 may be patterned in an island or stripe shape.

Note that in the case where the light absorption layer 106 or the material layer 108 is formed in an island shape in FIGS. 3A to 3D, it is preferably patterned to approximately the same size as that of a pixel to be formed over the deposition target substrate. In the case where the light absorption layer 106 or the material layer 108 is formed in a stripe shape, it is preferably formed such that the width of the light absorption layer 106 or the material layer 108 is approximately equal to that of a pixel to be formed over the deposition target substrate.

In the deposition donor substrate described in this embodiment, as the support substrate which forms the lens array 104, a glass substrate or a quartz substrate is preferably used. Thus, even when a layer formed over the support substrate 100 is subjected to etching treatment or photolithography, the shape of the lens array 104 is not affected. Thus, the light absorption layer or the material layer can be patterned in a desired shape.

In this embodiment, in the deposition method which is applied to a light emitting device, the thickness of the EL layers 207 to be deposited on the deposition target substrate 200 through evaporation treatment can be controlled by controlling the thickness of the material layer 108 formed over the support substrate 100. That is, the material layer 108 formed over the support substrate 100 may be directly evaporated; thus, a thickness monitor is not needed. Therefore, a practitioner does not have to adjust evaporation rate using a thickness monitor, and the deposition step can be fully automated. Accordingly, productivity can be improved.

By the deposition method which is applied to a light emitting device in this embodiment, an evaporation material contained in the material layer 108 can be uniformly heated. In the case where the material layer 108 includes plural kinds of evaporation materials, the EL layers 207, which contain the same evaporation materials at approximately the same weight ratio as that of the material layer 108, can be deposited to the deposition target substrate 200. As described above, in the deposition method of this embodiment, in the case where deposition is performed using plural kinds of evaporation materials having different evaporation temperatures, unlike the case of co-evaporation, evaporation rate of each evaporation material does not need to be controlled. Thus, without any complicated control of evaporation rate or the like, a layer including desired different kinds of evaporation materials can be deposited easily and accurately.

By application of this embodiment, it becomes possible to deposit a flat and uniform film. In addition, by application of this embodiment, a pattern of EL layers can be easily formed, and thus, manufacture of a light emitting device can be simplified. Furthermore, a fine pattern can be formed, and thus, a high-definition light emitting device can be obtained.

Accordingly, by application of this embodiment, it becomes easier to deposit a layer including desired different kinds of evaporation materials and it becomes possible to improve productivity in manufacturing a light emitting device or the like using the layer including different kinds of evaporation materials.

A deposition donor substrate of this embodiment includes a lens array on one surface and can improve light use efficiency by focusing irradiation light through the lens array. Thus, cycle time can be shortened, and manufacturing cost of a light emitting device can be reduced. In addition, the energy of light with which the deposition donor substrate is irradiated can be used more efficiently. In particular, even when a high-power multimode laser with poor light focusing characteristics is used as a light source, energy can be effectively used by the use of a lens array. Accordingly, a high-power laser can be used as a light source; thus, deposition can be performed over a large area at a time.

In addition, in a deposition donor substrate of this embodiment, a lens array for focusing laser light is directly provided on a support substrate for a light absorption layer and a material layer. Thus, there is no need for alignment between a laser light focusing lens and a support substrate, and a predetermined region of the light absorption layer can be accurately irradiated with laser light. In addition, the lens array is formed by processing the support substrate; thus, the lens array and the support substrate have an equal coefficient of thermal expansion. Accordingly, misalignment of an irradiation position and misalignment of a transfer target region for an EL layer due to a difference in coefficient of thermal expansion can be prevented, and a fine pattern of EL layers can be formed.

With the use of a deposition donor substrate of this embodiment, an evaporation material can be deposited with high use efficiency, and cost can be reduced. In addition, with the use of a deposition donor substrate of this embodiment, a layer of a desired shape can be formed with high accuracy.

In this embodiment, a deposition donor substrate that has been used once for deposition can be used plural times after removing a material layer and forming a new material layer again. Thus, manufacturing cost of a light emitting device can be reduced. In a deposition donor substrate described in this embodiment, a glass substrate or a quartz substrate is used as a support substrate. To these substrates, an impurity (such as moisture) is less likely to be adsorbed or attached than to a film substrate or the like. Thus, a deposition donor substrate of this embodiment is suitable for reuse.

Note that this embodiment can be appropriately combined with another embodiment disclosed in this specification.
(Embodiment 2)

In this embodiment, a method for manufacturing a light emitting device, which is different from the method described in Embodiment 1, is described with reference to FIGS. 4A and 4B and FIGS. 5A and 5B. Specifically, an example of a deposition method using the deposition donor substrate described in Embodiment 1 in combination with a slit is described. Note that the description of the same components as those in Embodiment 1 is simplified and partly omitted.

Figure 4A:
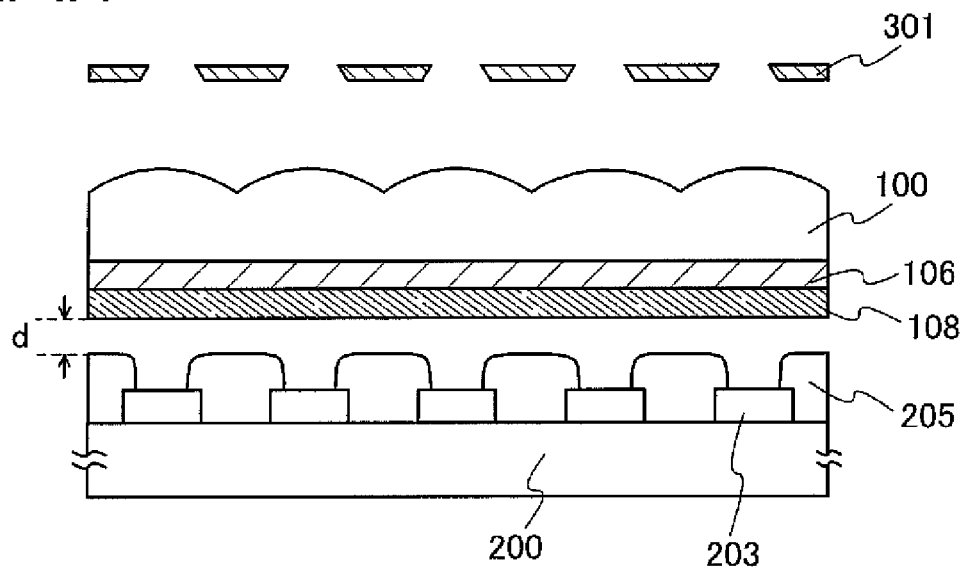
FIGS. 4A and 4B are diagrams illustrating an example of a deposition method.

As illustrated in FIG. 4A, a slit 301 is disposed in a position to face the surface of the deposition donor substrate 110 on which the lens array is provided. As in Embodiment 1, the deposition target substrate 200 is disposed in a position to face the surface of the deposition donor substrate 110 on which the light absorption layer 106 and the material layer 108 are formed. Note that the deposition donor substrate 110 in FIGS. 4A and 4B has a structure in which the light absorption layer and the material layer are formed over the entire surface of the support substrate 100 as illustrated in FIGS. 1A and 1B; however, this embodiment is not limited thereto. The deposition donor substrate may have any of the structures illustrated in FIGS. 3A to 3D.

Figure 4B:
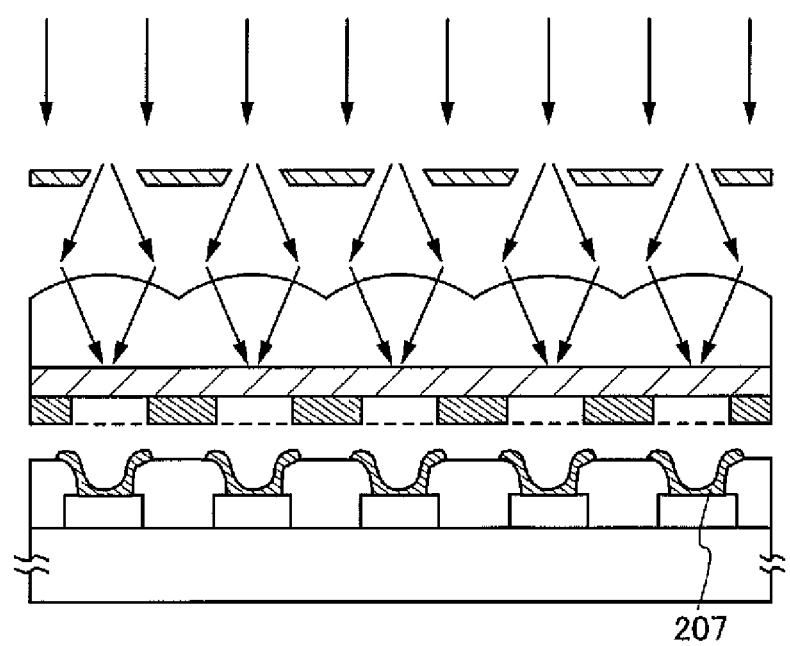

There are no particular limitations on the shape of a slit used in this embodiment, and for example, a slit 301 of a plate-like shape having openings as illustrated in FIGS. 4A and 4B can be used. The slit 301 is preferably designed such that the size of the openings can be adjusted in accordance with the kind or energy of irradiation light. In addition, the slit is desirably formed from a material that is not deformed or damaged by irradiation light.

The slit 301 and the deposition donor substrate 110 are desirably aligned with each other such that the openings of the slit 301 and convex portions of the lens array 104 overlap each other. For example, the deposition donor substrate 110 and the slit 301 can be aligned with each other by detecting the vertexes of the convex portions of the lens array 104. Alternatively, the slit 301 may be provided with an alignment marker.

Next, as illustrated in FIG. 4B, the surface of the deposition donor substrate 110 on which the lens array 104 is provided is irradiated with light through the slit 301.

As described above, when laser light is used as irradiation light, it is preferable that the beam spot of laser light with which the light absorption layer 106 is irradiated have a linear or rectangular shape. With laser light having a beam spot of a linear or rectangular shape, a process substrate can be efficiently scanned. As an optical system for shaping the beam spot of laser light into a linear or rectangular shape, a light focusing lens, a beam expander, a homogenizer, a polarizer, or the like may be used, or these may be used in combination. Each optical system serves to improve the energy uniformity of laser light on an irradiation surface as well as changing the cross-sectional shape of laser light into a linear shape.

However, in general, a beam spot formed through an optical system have portions with low energy density in both edge portions due to lens aberration or the like. When the light absorption layer 106 is irradiated with laser light having a region with low energy density, there are cases where the material layer 108 cannot be heated uniformly.

In this embodiment, the portions with low energy density in both edge portions of laser light with which the light absorption layer 106 is irradiated can be cut out through the slit 301. An image at an opening of the slit 301 is transferred to the light absorption layer 106 through the lens array 104 provided on the deposition donor substrate 110. Accordingly, at least part of the light absorption layer 106 can be selectively irradiated with a beam spot with uniform energy distribution. Thus, the material layer 108 in a region overlapped by the irradiated region of the light absorption layer 106 can be uniformly heated. An evaporation material heated is attached onto the first electrode layers, whereby the EL layers 207 are deposited.

Figure 5A:
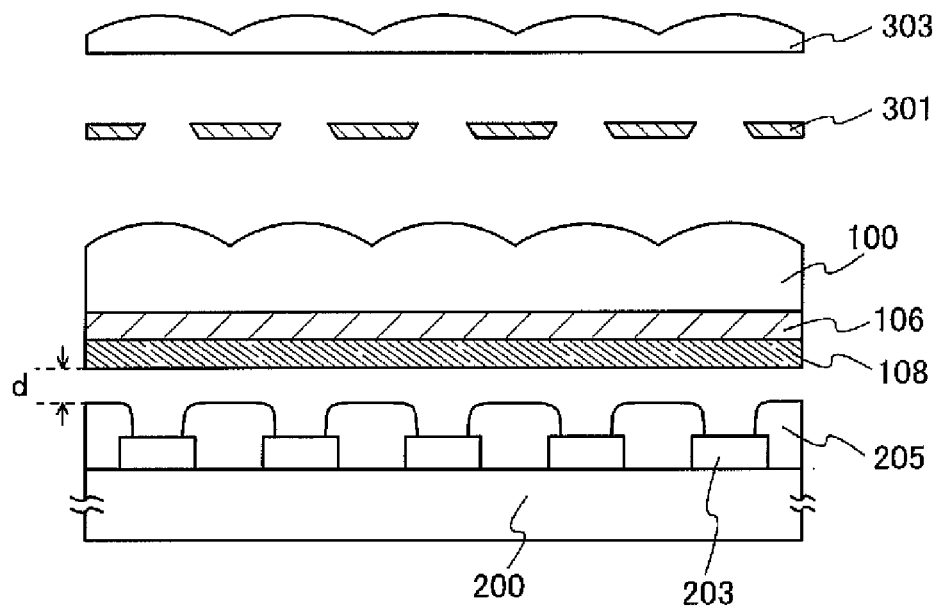
FIGS. 5A and 5B are diagrams illustrating an example of a deposition method.

In addition to the components illustrated in FIGS. 4A and 4B, a light focusing lens array 303 may be disposed on an optical path of light with which the deposition donor substrate 110 is irradiated and in front of the slit 301 as illustrated in FIG. 5A. Laser light formed into a linear or rectangular shape is projected onto the openings of the slit 301 through the light focusing lens array 303. In addition, through the openings of the slit 301, portions with low energy density in both edge portions are cut out.

There are no particular limitations on a lens included in the light focusing lens array 303, and for example, a spherical lens, a cylindrical lens, or the like can be used. The size of each beam spot of light focused through the light focusing lens array 303 can be appropriately set by changing the radius of curvature of a lens included in the lens array, the material of the lens array, the distance between the slit 301 and the light focusing lens array 303, or the like, and the size is preferably approximately the same as that of the opening of the slit 301.

Note that it is desired that the light focusing lens array 303 and the slit 301 be aligned with each other such that regions where light focused through the light focusing lens array 303 passes and the openings of the slit 301 overlap each other. For example, the light focusing lens array 303 and the slit 301 can be aligned with each other by detecting the vertexes of convex portions of the light focusing lens array 303. Alternatively, at least one of the slit 301 and a light exiting plane (hereinafter, a second plane) of the light focusing lens array 303 may be provided with an alignment marker.

Figure 5B:
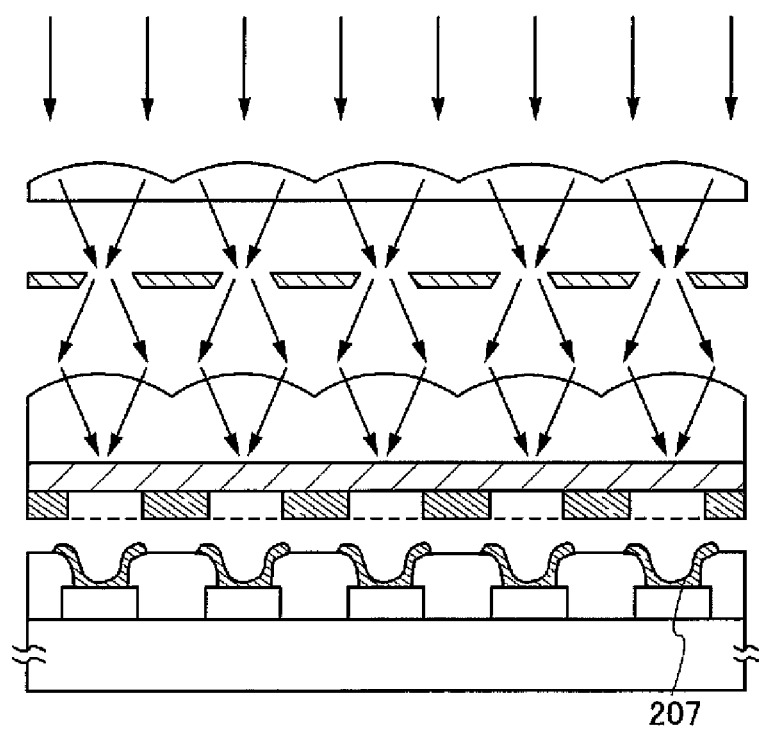

After the deposition target substrate 200, the deposition donor substrate 110, the slit 301, and the light focusing lens array 303 are each disposed, the deposition donor substrate 110 is irradiated with light through the light focusing lens array 303 and the slit 301 as illustrated in FIG. 5B. In the structure illustrated in FIGS. 5A and 5B, light emitted from a light source passes through the slit 301 after being focused through the light focusing lens array 303. Accordingly, energy that is cut out by the slit can be reduced, and energy of irradiation light can be effectively utilized.

In FIG. 5B, for example, BK7 is used as a lens material of the light focusing lens array 303; the thickness of a lens included in the light focusing lens array 303 is 0.7 mm; and the radius of curvature of a first plane is 0.3 mm. In addition, BK7 is used as a material of the lens array 104 provided on the deposition donor substrate 110; the thickness of the support substrate 100 is 0.7 mm; the radius of curvature is 0.16 mm; the slit 301 is disposed in contact with the second plane of the light focusing lens array 303; and the distance between the support substrate 100 and the second plane of the light focusing lens array 303 is 0.7 mm. In this case, the light absorption layer 106 provided on the deposition donor substrate can be irradiated with a beam spot having a width of 20 μm.

By the manufacturing method described in this embodiment, a light absorption layer can be selectively irradiated through a lens array with laser light whose portion with low energy density has been cut out through a slit. Accordingly, the material layer 108 in a region overlapped by the light irradiated region of the light absorption layer 106 can be uniformly heated. Thus, the EL layers 207 can be uniformly formed.

Note that this embodiment can be appropriately combined with another embodiment disclosed in this specification.

(Embodiment 3)

In this embodiment, a method for manufacturing a light emitting device capable of full-color display by forming EL layers of light emitting elements using a plurality of deposition donor substrates described in Embodiment 1 or 2 is described.

In Embodiments 1 and 2, cases are described in which EL layers of the same material are formed in a single deposition step over all of a plurality of electrodes which are formed over a second substrate that is a deposition target substrate. In this embodiment, a case is described in which one of three kinds of EL layers which emit light of different colors is formed over each of a plurality of electrodes formed over a second substrate.

First, deposition donor substrates described in Embodiment 1 or 2 are prepared. In this embodiment, for example, three deposition donor substrates illustrated in FIG. 3A are prepared. The deposition donor substrates are provided with respective material layers for forming EL layers which emit light of different colors. Specifically, a first deposition donor substrate having material layers (R) including a material for forming EL layers which exhibit red light emission (an EL layer (R)), a second deposition donor substrate having material layers (G) including a material for forming EL layers which exhibit green light emission (an EL layer (G)), and a third deposition donor substrate having material layers (B) including a material for forming EL layers which exhibit blue light emission (an EL layer (B)) are prepared.

In addition, one deposition target substrate 200 provided with a plurality of first electrodes illustrated in FIGS. 2A and 2B in Embodiment 1 is prepared. Note that edge portions of the plurality of first electrodes over the deposition target substrate are covered with an insulator; thus, light emitting regions correspond to regions which are part of the first electrodes and exposed without being covered with the insulator.

First, in a first deposition step, the deposition target substrate and the first deposition donor substrate are superimposed on each other and aligned with each other as in FIG. 2A. Note that it is preferable that the deposition target substrate be provided with an alignment marker. It is also preferable that the first deposition donor substrate be provided with an alignment marker. Because the first deposition donor substrate is provided with a light absorption layer, a portion of the light absorption layer near the alignment marker is desirably removed in advance. In addition, because the first deposition donor substrate is provided with the material layers (R), a portion of the material layers (R) near the alignment marker is desirably removed in advance. Note that although the manufacturing method described in Embodiment 1 is taken as an example in this embodiment, deposition may be conducted in accordance with the manufacturing method described in Embodiment 2.

Then, light irradiation is performed from the side of the first deposition donor substrate on which the lens array is provided. Light condensed through the lens array is absorbed by the light absorption layer, which provides heat to the material layers (R). Accordingly, the material included in the material layers (R) is heated, and EL layers (R) are formed over some of the first electrodes over the deposition target substrate. The first deposition donor substrate after the first deposition is completed is moved away from the deposition target substrate.

Next, in a second deposition step, the deposition target substrate and the second deposition donor substrate are superimposed on each other and aligned with each other. The second deposition donor substrate is disposed in a position which is shifted by one pixel from that of the first deposition donor substrate used in the first deposition.

Then, light irradiation is performed from the side of the second deposition donor substrate on which the lens array is provided. Light condensed through the lens array is absorbed by the light absorption layer, which provides heat to the material layers (G). Accordingly, the material included in the material layers (G) is heated, and EL layers (G) are formed over first electrodes which are located in pixels next to those including the first electrodes over which the EL layers (R) have been formed in the first deposition. The second deposition donor substrate after the second deposition is completed is moved away from the deposition target substrate.

Next, in a third deposition step, the deposition target substrate and the third deposition donor substrate are superimposed on each other and aligned with each other. The third deposition donor substrate is disposed in a position which is shifted by two pixels from that of the first deposition donor substrate used in the first deposition (i.e. in a position which is shifted by one pixel from that of the second deposition donor substrate used in the second deposition).

Figure 6A:
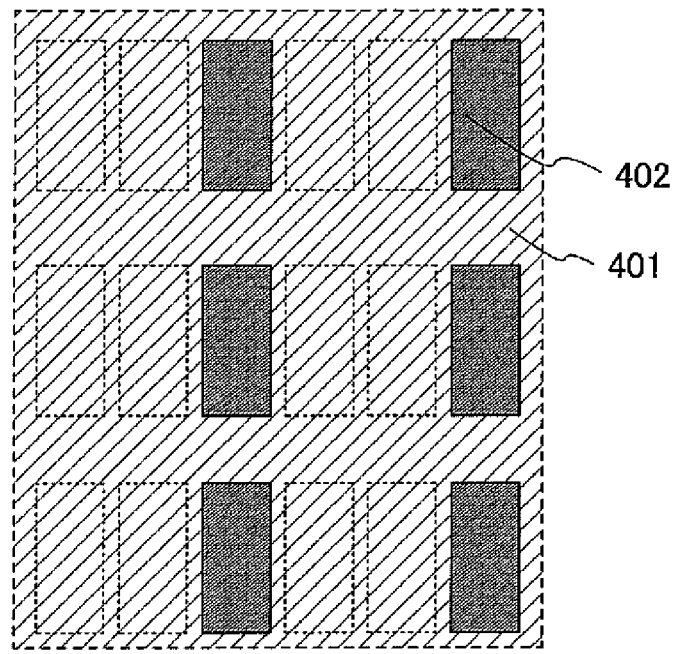
FIGS. 6A and 6B are diagrams illustrating an example of a method for manufacturing a light emitting device.

Then, light irradiation is performed from the side of the third deposition donor substrate on which the lens array is provided. A state right before the third deposition is performed corresponds to a top view in FIG. 6A. In FIG. 6A, island-like material layers 402 are formed on a light absorption layer 401. In addition, over regions of the deposition target substrate overlapped by the material layers 402 of the third deposition donor substrate, first electrodes are formed. Note that EL layers (R) 411 formed in the first deposition and EL layers (G) 412 formed in the second deposition are located under regions indicated by dotted lines in FIG. 6A.

Then, EL layers (B) 413 are formed in the third deposition. Light with which the deposition donor substrate is irradiated is condensed through the lens array and absorbed by the light absorption layer 401 located over the material layers 402. The light absorption layer 401 having absorbed light generates heat and provides heat to the material layers (B). Accordingly, the material included in the material layers (B) is heated, and the EL layers (B) 413 are formed over first electrodes which are over part of the deposition target substrate and are next to the first electrodes over which the EL layers (G) 412 are formed in the second deposition. The third deposition donor substrate after the third deposition is completed is moved away from the deposition target substrate.

In this manner, the EL layers (R) 411, the EL layers (G) 412, and the EL layers (B) 413 can be formed over the same deposition target substrate at regular intervals. Then, second electrodes are formed over these layers, whereby light emitting elements can be formed.

Through the above-described process, light emitting elements exhibiting light emission of different colors can be formed over the same substrate, whereby a light emitting device capable of full-color display can be manufactured.

Figure 6B:
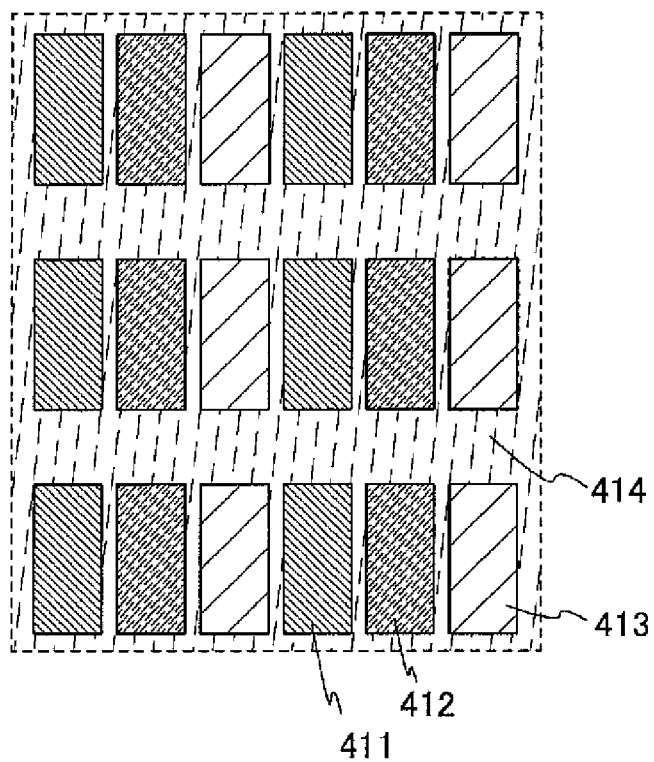

FIGS. 6A and 6B illustrate an example in which the material layers 402 formed over the deposition donor substrate have an island shape. Note that this embodiment is not particularly limited to the structure of FIGS. 6A and 6B. A plurality of spherical lenses each corresponding to one pixel may be disposed on a support substrate to form EL layers of an island shape. Alternatively, EL layers of a stripe shape may be formed. In the case where an EL layer of a stripe shape is formed, the EL layer is also formed in a region between light emitting regions of the same emission color. However, the EL layer is formed over an insulator 414; thus, a portion which overlaps the insulator 414 does not serve as a light emitting region. Note that in the case where an EL layer having a stripe shape is formed, a lens array provided on a support substrate preferably has a cylindrical lens shape.

Figure 7A:
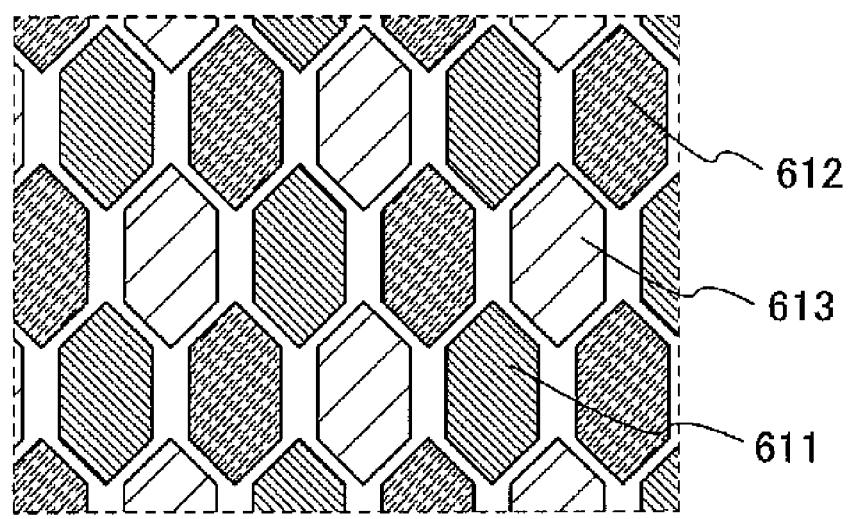
FIGS. 7A and 7B are diagrams illustrating an example of a method for manufacturing a light emitting device.
Figure 7B:
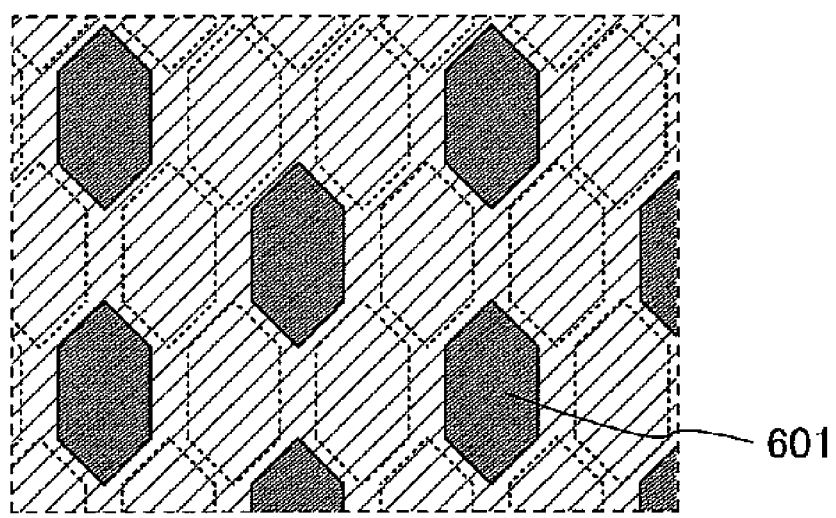

There are no particular limitations on the arrangement of pixels. Each pixel may have a polygonal shape, for example, a hexagonal shape as illustrated in FIG. 7A, and a full-color light emitting device may be realized by arrangement of EL layers (R) 611, EL layers (G) 612, and EL layers (B) 613. In order to form the polygonal pixels illustrated in FIG. 7A, deposition may be performed using a deposition donor substrate that includes polygonal material layers 601 as illustrated in FIG. 7B. Alternatively, light absorption layers may have a polygonal shape, or both light absorption layers and material layers may have a polygonal shape. In order to form such polygonal pixels as illustrated in FIGS. 7A and 7B, the lenses 102 formed on one surface of the support substrate 100 are preferably semi-spherical microlenses.

In the manufacture of a light emitting device capable of full-color display as described in this embodiment, by application of the deposition method described in Embodiment 1 or 2, it becomes possible to deposit a flat and uniform film. In addition, it becomes possible to form a fine pattern and to suppress blur where deposition is also performed to a region outside a desired pattern. Thus, a high-definition light emitting device can be obtained.

In the method for manufacturing a light emitting device of this embodiment, by preparing deposition donor substrates which are provided with material layers in advance and replacing the deposition donor substrates one by one, successive deposition on a deposition target substrate can be achieved. Accordingly, by application of this embodiment, the time it takes to manufacture a light emitting device (the cycle time) can be shortened, and productivity can be improved.

A deposition donor substrate that has been used once for deposition can be used plural times after removing a material layer and forming a new material layer again. Thus, manufacturing cost of a light emitting device can be reduced. In a deposition donor substrate described in Embodiment 1 or 2, a glass substrate or a quartz substrate is used as a support substrate. To these substrates, an impurity (such as moisture) is less likely to be adsorbed or attached than to a film substrate or the like. Thus, a deposition donor substrate described in Embodiment 1 or 2 is suitable for reuse.

In the deposition method described in this embodiment, unlike in the case of forming an EL layer by a wet method, there is no need to consider solubility or the like of a previously formed layer; thus, there is a wider choice of kinds of deposition materials. In addition, the number of layers stacked can be freely set. Thus, a light emitting device with a desired stacked-layer structure can be formed using desired materials. It is important in terms of improvement in performance of a light emitting device that the kind of material used or the stacked layer structure can be freely designed particularly when the size of a substrate is increased.

In the manufacture of a light emitting device capable of full-color display as described in this embodiment, by the application of a deposition donor substrate described in Embodiment 1 or 2, a desired material can be deposited on a deposition target substrate without being wasted. Thus, material use efficiency can be improved and manufacturing cost can be decreased. In addition, attachment of a material to the inner wall of a deposition chamber can be prevented, which allows maintenance of a deposition apparatus to be simplified.

In this embodiment, a high-power laser can be used as a light source; thus, deposition can be performed over a large area at a time. Accordingly, the time it takes to manufacture a light emitting device (the cycle time) can be shortened, and productivity can be improved.

In the manufacture of a light emitting device capable of full-color display as described in this embodiment, by control of the thickness of a material layer formed on a deposition donor substrate, the thickness of a film to be deposited on a deposition target substrate can be controlled. In other words, the thickness of a material layer is controlled in advance such that a film to be formed over a deposition target substrate by deposition of the whole material included in the material layer formed on the deposition donor substrate has a desired thickness. Thus, a thickness monitor is not necessary when deposition is performed on the deposition target substrate. Therefore, a practitioner does not have to adjust deposition rate using a thickness monitor, and the deposition step can be fully automated. Accordingly, productivity can be improved.

In the manufacture of a light emitting device capable of full-color display as described in this embodiment, by the application of a deposition donor substrate described in Embodiment 1 or 2, a material included in a material layer formed on the deposition donor substrate can be uniformly deposited. Even in the case where a material layer includes plural kinds of materials, a film including the same materials at approximately the same weight ratio as that of the material layer can be deposited on a deposition target substrate. Accordingly, by the deposition method described in this embodiment, even in the case of deposition of plural kinds of materials which are moved to a deposition target substrate at different temperatures, a layer including desired different materials can be deposited easily and accurately without any complicated control of evaporation rate or the like.

Note that the structure described in this embodiment can be appropriately used in combination with a structure described in another embodiment.

(Embodiment 4)

In this embodiment, an example of a deposition apparatus for performing deposition by laser light irradiation of a deposition donor substrate and a laser light irradiation method are described.

Figure 8:
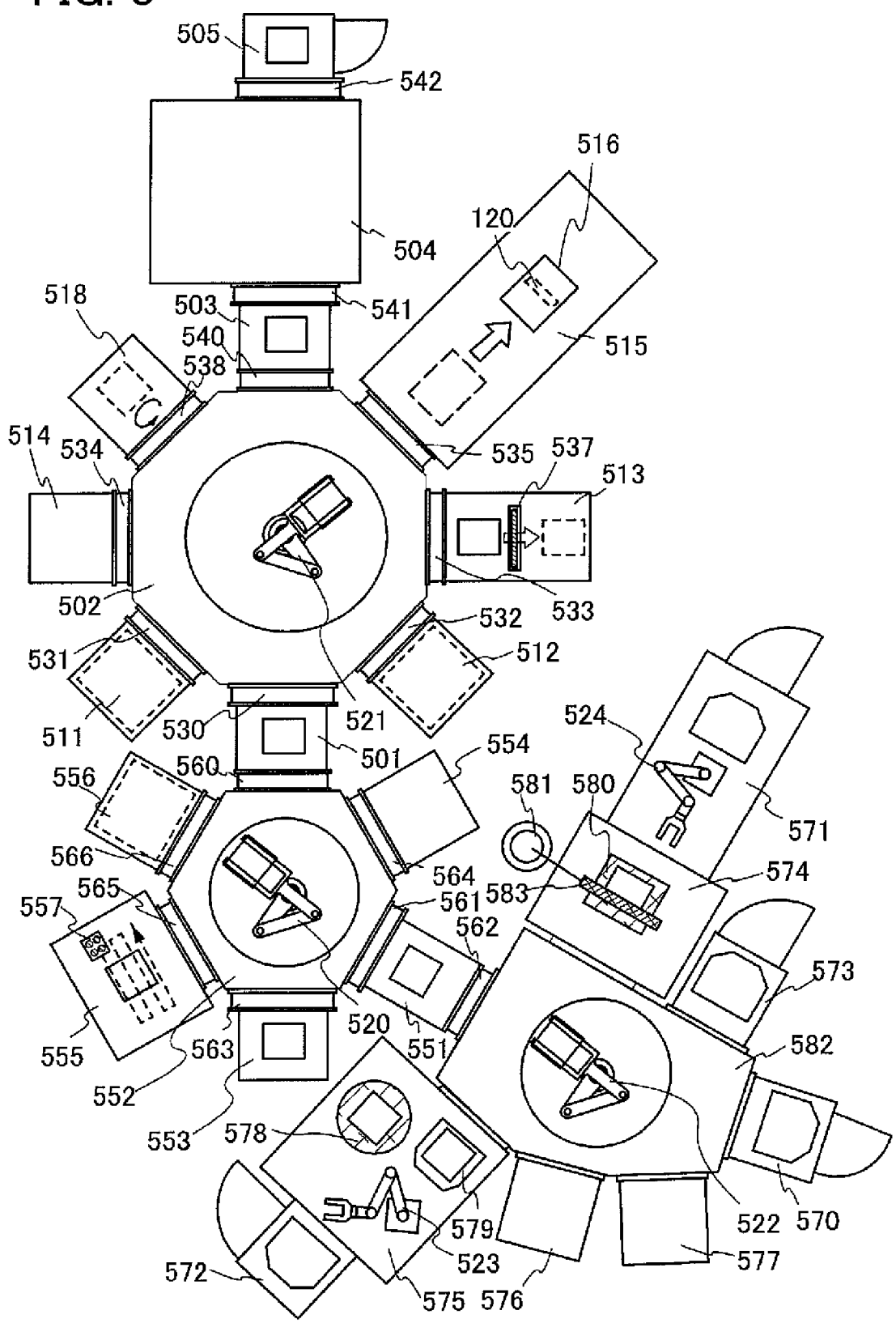
FIG. 8 is a diagram illustrating an example of a deposition apparatus.

FIG. 8 is a top view of an example of a manufacturing apparatus.

The manufacturing apparatus illustrated in FIG. 8 includes a first transfer chamber 582 and a second transfer chamber 552, which are connected to each other via a first delivery chamber 551. The manufacturing apparatus also includes a third transfer chamber 502, which is connected to the second transfer chamber 552 via a second delivery chamber 501. The manufacturing apparatus also includes a sealing chamber 504, which is connected to the third transfer chamber 502 via a third delivery chamber 503.

The second transfer chamber 552, the third transfer chamber 502, and the sealing chamber 504 can each be connected to a vacuum evacuation process chamber and evacuated to vacuum to prevent mixture of moisture or the like. In addition, after vacuum evacuation, the chambers can be placed under the atmospheric pressure by introduction of an inert gas. For the vacuum evacuation process chamber, a magnetic floating turbo molecular pump, a cryopump, or a dry pump is used. With such a pump, the ultimate vacuum in the transfer chambers connected to other chambers can be set to $10^{-3}$ Pa to $10^{-6}$ Pa, and reverse diffusion of impurities from the pump side and from an evacuation system can be controlled.

First, a support substrate of a deposition donor substrate is placed in a first cassette chamber 571, a second cassette chamber 572, or a third cassette chamber 573. One chamber is selected from these three cassette chambers according to a film to be deposited to the deposition donor substrate. The support substrate is provided with a lens array on one surface and at least a light absorption layer on the other surface. Note that the lens array may be formed in a portion other than a peripheral portion of the support substrate so that the support substrate can be gripped by a transfer robot.

In the case where a material layer is selectively formed over the support substrate with a droplet discharge apparatus, the support substrate is set in a face-up mode in the first cassette chamber 571 and is transferred to a process chamber 574 including a droplet discharge apparatus with the use of a transfer unit 524 provided in the first cassette chamber 571, and droplet discharge is performed. The transfer unit 524 can turn a substrate upside down, and the substrate can be transferred upside down into the process chamber 574; therefore, the support substrate may be set in a face-down mode in the first cassette chamber 571 in order to prevent dust from attaching to the light absorption layer on the support substrate.

The process chamber 574 is provided with a droplet discharge unit 583 having a head with a plurality of nozzles arranged in one axial direction, a control portion that controls the droplet discharge unit 583, a stage 580 that fixes a substrate and moves in X, Y, and θ directions, an ink bottle 581 that supplies the droplet discharge unit 583 with a composition, and the like.

After droplet discharge is performed, the support substrate is transferred to a bake chamber 576 using a transfer unit 522 of the first transfer chamber 582 connected to the process chamber 574, and drying or baking is performed. A plurality of substrates can be heated in the bake chamber 576, which can also function as a stock chamber for stocking support substrates.

In the case where a material layer is formed over an entire surface of the support substrate by a spin coating method, a spray method, or the like with a coating apparatus, the support substrate is set in a face-up mode in the second cassette chamber 572 and is transferred to a process chamber 575 having a coating apparatus with the use of a transfer unit 523, and coating is performed. The transfer unit 523 can also turn a substrate upside down, and the substrate can be placed upside down onto a stage 578; therefore, the support substrate may be set in a face-down mode in the second cassette chamber 572 in order to prevent dust from attaching to the light absorption layer on the support substrate.

The process chamber 575 is provided with a nozzle that drips a material liquid, the stage 578 that fixes a substrate and rotates, a control portion that controls the number of rotations of the stage, a stage 579 on which a substrate coated with the material liquid is placed, a tank that supplies the nozzle with the material liquid, and the like.

After droplet discharge is performed, the support substrate is transferred to the bake chamber 576 using the transfer unit 522 of the first transfer chamber 582 connected to the process chamber 575, and drying or baking is performed.

In the case where a resistance heating method is used to form a material layer over the support substrate, the support substrate is set in a face-down mode in the third cassette chamber 573 and is transferred to the first delivery chamber 551 with the use of the transfer unit 522 of the first transfer chamber 582 connected to the third cassette chamber 573.

Further, the support substrate is transferred to a pretreatment chamber 553 using a transfer unit 520 provided in the second transfer chamber 552 connected to the first delivery chamber 551, and in order to remove moisture or gases from the substrate, annealing for degasification is performed in a vacuum (of $5\times10^{-3}$ Pa or less, preferably $10^{-4}$ Pa to $10^{-6}$ Pa). Then, the support substrate is transferred to a process chamber 555 using the transfer unit 520, and evaporation is performed by a resistance heating method.

The process chamber 555 is provided with a unit for moving an evaporation source 557 along a path designated by a dotted line in the chamber, a unit for fixing a substrate, a vacuum evacuation process chamber, and the like. The evaporation source 557 is provided with a plurality of crucibles, and evaporation materials in the crucibles are heated by a resistance heating method. In the process chamber 555, the evaporation source is moved under the substrate set in a face-down mode, thereby performing evaporation. In the case where selective deposition is performed using an evaporation mask, an evaporation mask stocked in a process chamber 554 may be transferred to the process chamber 555, and the evaporation mask may be aligned with the substrate, and evaporation may be performed.

Then, the deposition donor substrate provided with the material layer in the process chamber is transferred to the third transfer chamber 502 and is further transferred to a laser light irradiation chamber 515 using a transfer unit 521 provided in the third transfer chamber 502, with a surface provided with the material layer facing upward, i.e., in a face-up mode. In the case where the material layer of the deposition donor substrate is deposited by an evaporation method, the surface provided with the material layer faces downward after the material layer is formed; therefore, in such a case, the substrate is turned upside down with a substrate turning mechanism provided in a process chamber 518 and is then transferred to the laser light irradiation chamber 515.

The process chamber 518 may be used not only for turning a substrate upside down but also for stocking a plurality of substrates. If the transfer unit 521 can turn a substrate upside down, the substrate turning mechanism is not necessarily provided in the process chamber 518, and the process chamber 518 may be used for stocking a plurality of substrates.

Further, a second substrate, which is a deposition target substrate, is set in a face-down mode in a fourth cassette chamber 570 and is transferred to the first delivery chamber 551 using the transfer unit 522 of the first transfer chamber 582 connected to the fourth cassette chamber 570. Furthermore, the second substrate is transferred to the pretreatment chamber 553 using the transfer unit 520 provided in the second transfer chamber 552 connected to the first delivery chamber 551, and in order to remove moisture or gases from the second substrate, annealing for degasification is performed in a vacuum. In particular, in the case where a TFT is formed over the second substrate, if an organic resin material is used as a material of an interlayer insulating film or a partition, some organic resin materials adsorb moisture easily and degasification can be caused; thus, it is effective to perform vacuum heating in which adsorbed moisture is removed by heating the second substrate at 100° C. to 350° C., preferably at 150° C. to 200° C. for 30 minutes or more, for example, and cooling down the second substrate naturally for approximately 30 minutes before forming a layer with the organic resin material.

If a passive-matrix light emitting device is manufactured, at least first electrodes in a stripe form are formed over the second substrate in advance. If an active-matrix light emitting device is manufactured, first electrodes and switching elements that are electrically connected to the first electrodes, such as thin film transistors in which an amorphous semiconductor film, a polycrystalline semiconductor film, a microcrystalline semiconductor film, or a single crystal semiconductor film functions as an active layer, are formed over the second substrate in advance.

After that, the second substrate, which is the deposition target substrate, is transferred to the second delivery chamber 501 using the transfer unit 520 and is further transferred to the laser light irradiation chamber 515 using the transfer unit 521 provided in the third transfer chamber 502 connected to the second delivery chamber 501, with a surface provided with the first electrodes facing downward, i.e., in a face-down mode.

The laser light irradiation chamber 515 has a window 120 at a bottom portion for introducing laser light emitted from a laser light source into the laser light irradiation chamber.

After being transferred to the laser light irradiation chamber 515, the deposition donor substrate is aligned with the second substrate, which is the deposition target substrate, to face each other, and the substrates are held at a certain distance d with a unit 516 for holding a pair of substrates. Then, the pair of substrates are irradiated with laser light, and a laser light irradiation region is relatively moved to perform scanning with the laser light.

Figure 9:
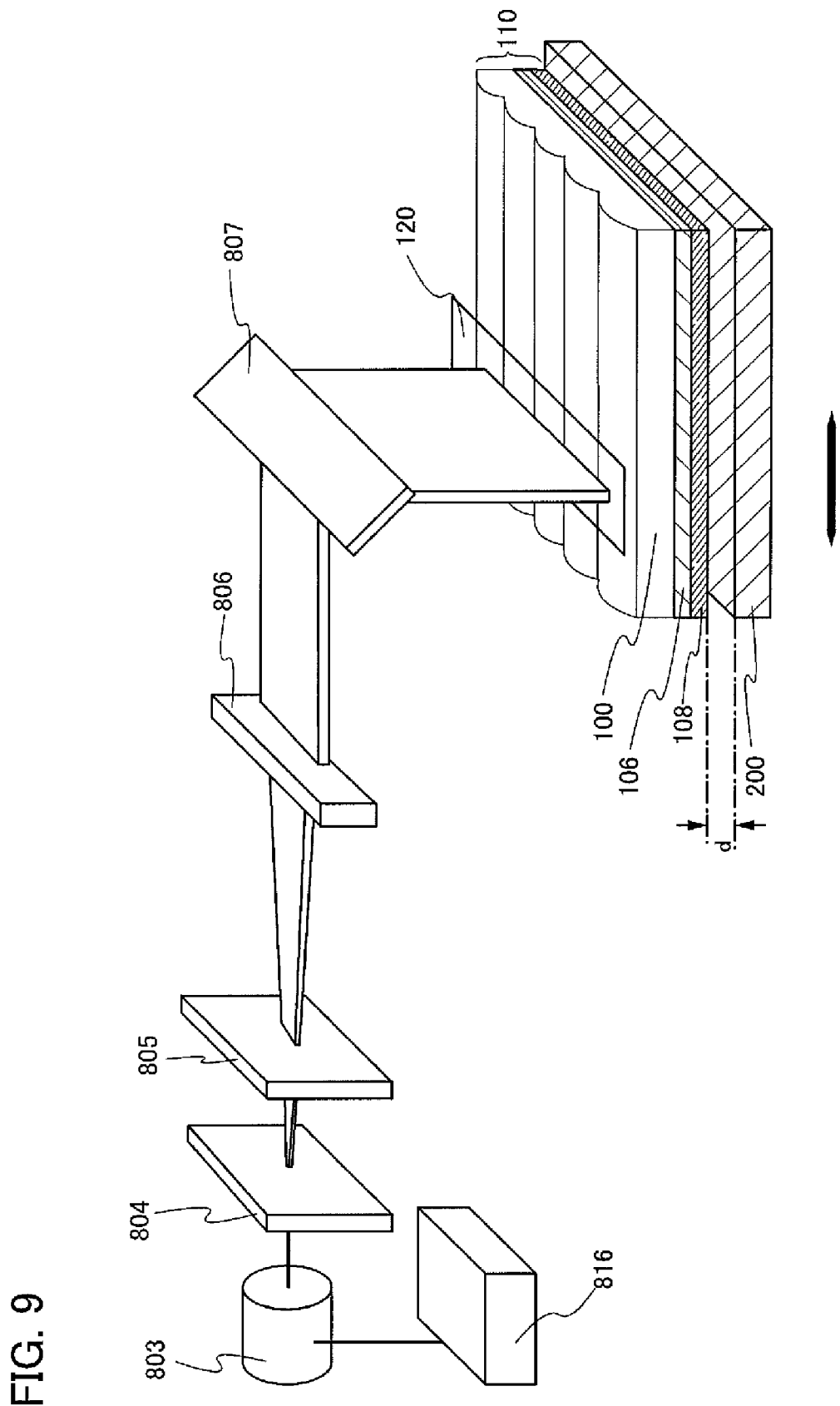
FIG. 9 is a diagram illustrating an example of a deposition apparatus.

FIG. 9 is a schematic diagram illustrating a positional relation between the window 120 and a laser device 803 during deposition.

Laser light emitted is output from the laser device 803 and is transmitted through optical systems 804, 805, and 806 for changing a beam shape into a linear shape, and its optical path is bent in a direction perpendicular to the deposition donor substrate 110 by a reflecting mirror 807. Then, the laser beam is transmitted through the window 120 for introducing light and through the deposition donor substrate 110, so that the light absorption layer 106 is irradiated with the laser beam. The window 120 may have the same size as or a smaller size than the width of the laser beam, in which case the window 120 can function as a slit. Note that in the case where the lens array provided on the support substrate has a cylindrical lens shape as illustrated in FIG. 9, scanning is preferably performed by moving laser light (or the deposition donor substrate and the deposition target substrate) parallel to the axial direction of the cylindrical lens (a direction in which light is not refracted). The direction is shown by an arrow in FIG. 9.

It is preferable that a control device 816 be designed to be able to control the unit 516 for holding and moving a pair of substrates. It is also preferable that the control device 816 be designed to be able to control the laser device 803. Further, it is preferable that the control device 816 work with a position alignment mechanism having an image pickup element to detect a position marker.

When the laser light scanning is completed, a region of the material layer 108 which is overlapped by the light irradiated region of the light absorption layer 106 has disappeared and deposition has been selectively performed to the deposition target substrate 200 that faces the deposition donor substrate 110.

If the remaining part of the material layer 108 is removed from the deposition donor substrate 110 which has undergone laser light scanning, the deposition donor substrate 110 can be used again. The deposition donor substrate 110 which has undergone laser light scanning is transferred to a cleaning chamber 577, and the remaining part of the material layer 108 is removed.

Note that FIGS. 8 and 9 illustrate the deposition method by laser light scanning, but this embodiment is not limited to this example. For example, a beam spot may be formed through an optical system in accordance with an irradiation region, and irradiation may be performed while the beam spot is locally shifted.

Through the above steps, a material layer with a single layer structure can be selectively deposited on the deposition target substrate 200. If a material layer with a stacked-layer structure is deposited, a second deposition donor substrate is prepared in advance; the first deposition donor substrate which has undergone laser light scanning is replaced with the second deposition donor substrate; the second deposition donor substrate is aligned with the deposition target substrate to face each other in the laser light irradiation chamber 515; and the substrates are held at a certain distance with the unit 516 for holding a pair of substrates. After that, the pair of substrates are irradiated with laser light, and second laser light scanning is further performed with a laser light irradiation region moved relatively.

The second deposition donor substrate is provided with a lens array on one surface and a light absorption layer on the other surface. In a similar manner to the first deposition donor substrate, the second deposition donor substrate is set in the first cassette chamber 571, the second cassette chamber 572, or the third cassette chamber 573, and a second layer of a material layer is formed as appropriate in the process chamber.

If another layer is to be further stacked in the laser light irradiation chamber 515, a third deposition donor substrate is taken into the laser light irradiation chamber 515 without taking the deposition target substrate 200 out of the laser light irradiation chamber 515; the third deposition donor substrate is aligned with the deposition target substrate 200 to face each other, and laser light irradiation is performed; and third laser light scanning is performed with a laser light irradiation region moved relatively. Through similar steps, four or more layers can be stacked.

In the case where deposition is performed with the use of the laser light irradiation chamber 515, material layers are formed on the first deposition donor substrate, the second deposition donor substrate, the third deposition donor substrate, and the like and the substrates are stocked in the process chamber 518 in advance before taking the deposition target substrate into the laser light irradiation chamber 515; after taking the deposition target substrate into the laser light irradiation chamber 515, the first to third deposition donor substrates are successively replaced one by one and layers are stacked, whereby the steps can proceed efficiently. In a deposition method in which a material layer which is formed in advance on a different substrate from a deposition target substrate is heated with laser light, the amount of material necessary for deposition is suppressed and the amount of material evaporated is reduced compared to that in a conventional resistance heating method; thus, a plurality of transfer robots, alignment units, substrate move units, or the like can be provided in the laser light irradiation chamber 515 where deposition is performed. Further, the deposition method in which a material layer which is formed in advance on a different substrate from a deposition target substrate is heated with laser light can prevent different light emitting materials from mixing even if different light emitting layers are formed in the same process chamber (the laser light irradiation chamber 515).

When five or more layers are formed as an EL layer included in a light emitting element, it is possible to form all the layers of the EL layer with the use of the laser light irradiation chamber 515; at least one layer may be formed with the use of the laser light irradiation chamber 515.

For example, after stacking hole injecting layers and hole transporting layers over first electrodes with the use of the laser light irradiation chamber 515, red light emitting layers and green light emitting layers can be selectively formed and blue light emitting layers may be formed in a process chamber 512 by a resistance heating method with a substrate being rotated. In the case where blue light emitting layers are selectively formed, an evaporation mask stocked in the process chamber 554 may be transferred to the process chamber 512 and aligned with the deposition target substrate, and evaporation may be performed. An evaporation source, a substrate rotating unit, a unit for alignment with an evaporation mask, and the like are provided in the process chamber 512.

In the case where electron transporting layers or electron injecting layers are formed by a resistance heating method, these layers may be formed in a process chamber 513. The process chamber 513 is provided with a unit for moving the deposition target substrate in a direction designated by an arrow over an evaporation source 537 in the chamber, a vacuum evacuation process chamber, and the like. The evaporation source 537 has a long linear shape, and an evaporation material is heated by a resistance heating method. If selective deposition is performed, an evaporation mask stocked in the process chamber 554 may be transferred to the process chamber 513 and aligned with the deposition target substrate, and evaporation may be performed with the deposition target substrate and the evaporation mask moved.

In the case where hole injecting layers or hole transporting layers are formed by a resistance heating method, these layers may be formed in the process chamber 555.

In the case where red light emitting layers are formed by a resistance heating method, these layers may be formed in a process chamber 511. In the case where green light emitting layers are formed by a resistance heating method, these layers may be formed in a process chamber 556. Each of the process chambers 511 and 556 is provided with an evaporation source, a substrate rotating unit, a unit for alignment with an evaporation mask, a vacuum evacuation process chamber, and the like. Although this embodiment presents an example in which light emitting layers of different emission colors are formed in their respective process chambers 556, 511, and 512, there is no particular limitation. For example, the red light emitting layers may be formed in the process chamber 555 or 513, and a practitioner can select a chamber as appropriate. Further, needless to say, the hole injecting layers, the hole transporting layers, the electron transporting layers, or the electron injecting layers may be formed in the process chamber 556, 511, or 512.

An example is presented here in which after setting the deposition target substrate in the fourth cassette chamber 570, the deposition target substrate is transferred to the second transfer chamber 552 without being transferred to another process chamber; however, before transferring the deposition target substrate to the second transfer chamber 552, films may be formed on the deposition target substrate in the process chamber 575 or 574, and the deposition target substrate may be transferred to the laser light irradiation chamber 515, and layers may be stacked. In such a case, a high molecular compound such as poly(3,4-ethylenedioxythiophene)/poly (styrenesulfonate) (PEDOT/PSS) can be used for the hole injecting layers on the first electrodes. As a substance having a high hole transporting property which is used for the hole injecting layers, any of various compounds such as high molecular compounds (oligomers, dendrimers, polymers, and the like) can be used.

If a spin coating method is used to form a film, the film is formed over an entire surface of the support substrate; thus, it is preferable to selectively remove the film at a side face or in a peripheral portion of the deposition target substrate, in a terminal portion, in a region in which a cathode (the second electrode) and a lower wiring are connected, and the like by $O_2$ ashing or the like using a mask in the pretreatment chamber 553. A plasma producing unit is provided in the pretreatment chamber 553, and one or plural kinds of gases selected from Ar, H, F, and O are excited to produce plasma, thereby performing dry etching. With the use of a mask, only an unnecessary portion can be selectively removed. Further, the pretreatment chamber 553 may be provided with a UV irradiation mechanism so that ultraviolet ray irradiation can be performed as surface treatment for an anode (the first electrodes). As described above, it is preferable that not only vacuum heating but also another treatment such as plasma treatment or UV irradiation treatment can be performed in the pretreatment chamber 553.

After forming the EL layers on the deposition target substrate through any one of the deposition steps described above, electrodes which function as the second electrodes of the light emitting elements is formed. The second electrodes are formed by a sputtering method, an electron beam method, or the like. If a sputtering method is employed, a process chamber 514 is provided with a plasma producing unit, a sputtering target, and a unit for introducing a source gas. Since a film is formed in a face-down mode when a sputtering method or an electron beam method is employed, the deposition target substrate can be smoothly transferred out of the laser light irradiation chamber 515 or the process chamber in which a resistance heating method is used.

After forming the second electrodes, the deposition target substrate is transferred to the third delivery chamber 503 through a gate valve 540 using the transfer unit 521 and further to the sealing chamber 504 through a gate valve 541. The substrate which has undergone sealing in the sealing chamber 504 is transferred to an unload chamber 505 through a gate valve 542 and can be taken out of the manufacturing apparatus. Through the above process, light emitting diodes (also referred to as EL elements) can be manufactured.

In the manufacturing apparatus illustrated in FIG. 8, the process chambers and the transfer chambers to be placed under reduced pressure are provided with gate valves 530 to 535, 538, and 560 to 566.

With the use of such a deposition apparatus, a light emitting device can be manufactured. With the use of the deposition apparatus described in this embodiment, by preparing deposition donor substrates which are provided with material layers in advance and replacing the deposition donor substrates one by one, successive deposition onto a deposition target substrate can be achieved. Accordingly, the time it takes for deposition (the cycle time) can be shortened, and productivity can be improved.

By application of this embodiment, it becomes possible to deposit a flat and uniform film. It also becomes possible to form a fine pattern and to suppress blur where deposition is also performed to a region outside a desired pattern. Thus, a high-definition light emitting device can be obtained.

In this embodiment, unlike in the case of forming an EL layer by a wet method, there is no need to consider solubility or the like of a previously formed layer; thus, there is a wider choice of kinds of deposition materials. In addition, the number of layers stacked can be freely set. Thus, a light emitting device with a desired stacked-layer structure can be formed using desired materials. It is important in terms of improvement in performance of a light emitting device that the kind of material used or the stacked layer structure can be freely designed particularly when the size of a substrate is increased.

In the manufacture of a light emitting device capable of full-color display as described in this embodiment, by the application of the deposition donor substrate described in the above embodiment, a desired material can be deposited onto a deposition target substrate without being wasted. Thus, material use efficiency can be improved and manufacturing cost can be decreased. In addition, attachment of a material to the inner wall of a deposition chamber can be prevented, which allows maintenance of a deposition apparatus to be simplified.

In this embodiment, a high-power laser can be used as a light source; thus, deposition can be performed over a large area at a time. Accordingly, the time it takes to manufacture a light emitting device (the cycle time) can be shortened, and productivity can be improved.

In this embodiment, by the control of the thickness of a material layer formed on a deposition donor substrate, the thickness of a film to be deposited to a deposition target substrate can be controlled. Thus, a thickness monitor is not necessary when deposition is performed to the deposition target substrate. Therefore, a practitioner does not have to adjust deposition rate using a thickness monitor, and the deposition step can be filly automated. Accordingly, productivity can be improved.

By application of this embodiment, a material included in a material layer formed on a deposition donor substrate can be uniformly deposited. Even in the case where a material layer includes a plurality of materials, a film including the same materials as the material layer at approximately the same weight ratio can be deposited onto a deposition target substrate. Accordingly, by the deposition method according to this embodiment, even in the case of deposition of a plurality of materials which vaporize at different temperatures, a layer including desired different materials can be deposited easily and accurately without any complicated control of evaporation rate or the like.

Note that the structure described in this embodiment can be appropriately used in combination with a structure described in another embodiment.

(Embodiment 5)

In this embodiment, a method for manufacturing a light emitting element and a light emitting device by application of the deposition donor substrate and the deposition method described in the above embodiment is described.

Figure 10A:
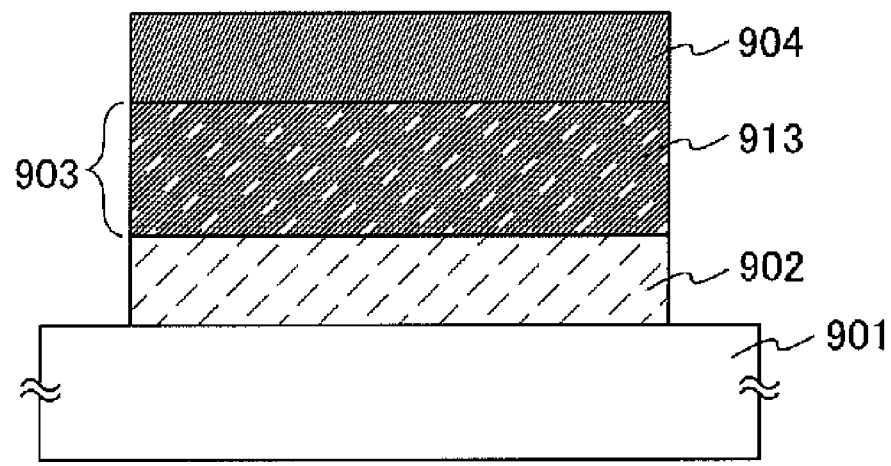
FIGS. 10A and 10B are diagrams each illustrating an example of a light emitting element.
Figure 10B:
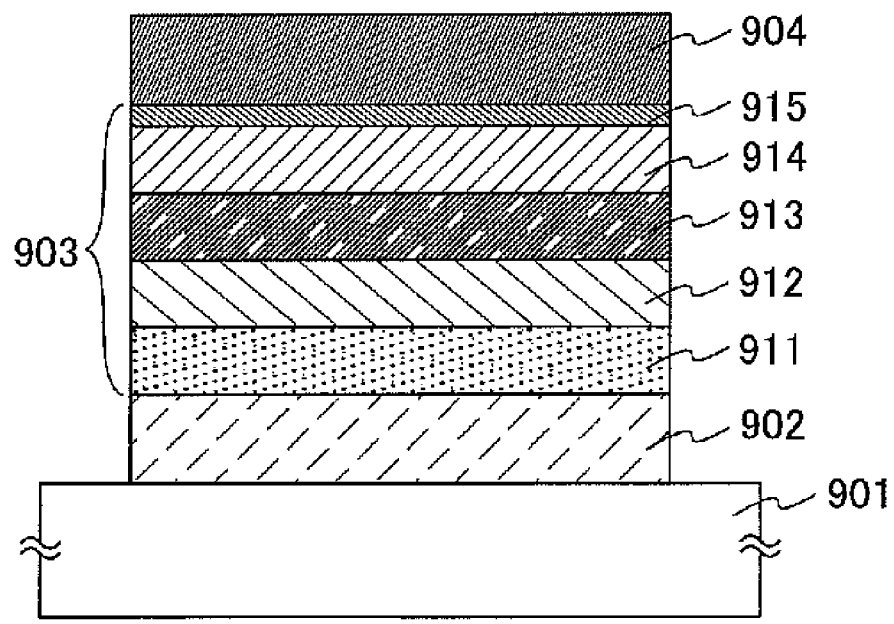

By application of the deposition method described in the above embodiment, light emitting elements illustrated in, for example, FIGS. 10A and 10B can be manufactured. In the light emitting element illustrated in FIG. 10A, a first electrode 902, an EL layer 903 formed with only a light emitting layer 913, and a second electrode 904 are stacked in this order over a substrate 901. One of the first electrode 902 and the second electrode 904 functions as an anode, and the other functions as a cathode. Holes injected from the anode and electrons injected from the cathode are recombined in the EL layer 903, whereby light emission can be obtained.

In this embodiment, the first electrode 902 functions as an anode and the second electrode 904 functions as a cathode.

The light emitting element illustrated in FIG. 10B has a structure in which a plurality of layers are stacked in the EL layer 903 of FIG. 10A. Specifically, a hole injecting layer 911, a hole transporting layer 912, a light emitting layer 913, an electron transporting layer 914, and an electron injecting layer 915 are provided in this order from the first electrode 902 side. Note that the EL layer 903 functions as long as it has at least the light emitting layer 913 as illustrated in FIG. 10A; thus, there is no need to provide all of these layers and a layer to be provided may be appropriately selected as needed.

As the substrate 901 illustrated in FIGS. 10A and 10B, a substrate having an insulating surface or an insulating substrate is employed. Specifically, any of a variety of glass substrates used for the electronics industry, such as an aluminosilicate glass substrate, an aluminoborosilicate glass substrate, or a barium borosilicate glass substrate; a quartz substrate; a ceramic substrate; a sapphire substrate; or the like can be used.

For the first electrode 902 and the second electrode 904, any of various types of metals, alloys, electrically conductive compounds, mixtures thereof, and the like can be used. Specific examples are as follows: indium tin oxide (ITO); indium tin oxide containing silicon or silicon oxide; indium zinc oxide (IZO); indium oxide containing tungsten oxide and zinc oxide; and the like. Other examples are as follows: gold (Au); platinum (Pt); nickel (Ni); tungsten (W); chromium (Cr); molybdenum (Mo); iron (Fe); cobalt (Co); copper (Cu); palladium (Pd); nitride of a metal material (such as titanium nitride); and the like.

Films of these materials are generally formed by a sputtering method. For example, a film of indium zinc oxide can be formed by a sputtering method using a target in which zinc oxide of 1 wt % to 20 wt % is added to indium oxide. A film of indium oxide containing tungsten oxide and zinc oxide can be formed by a sputtering method using a target which contains tungsten oxide of 0.5 wt % to 5 wt % and zinc oxide of 0.1 wt % to 1 wt % with respect to indium oxide. Alternatively, films of these materials may be formed by an inkjet method, a spin coating method, or the like by application of a sol-gel method or the like.

Furthermore, aluminum (Al), silver (Ag), an alloy containing aluminum, or the like can be used. Moreover, any of the following materials having a low work function can be used: elements which belong to Group 1 and Group 2 of the periodic table, that is, alkali metals such as lithium (Li) and cesium (Cs) and alkaline earth metals such as magnesium (Mg), calcium (Ca), and strontium (Sr), and alloys thereof (an alloy of aluminum, magnesium, and silver and an alloy of aluminum and lithium); rare earth metals such as europium (Eu) and ytterbium (Yb), and alloys thereof; and the like.

Films of alkali metals, alkaline earth metals, and alloys thereof can be formed by a vacuum evaporation method. Furthermore, films of alloys each containing an alkali metal or an alkaline earth metal can be formed by a sputtering method. Alternatively, a film of silver paste or the like can be formed by an inkjet method or the like. Each of the first electrode 902 and the second electrode 904 is not limited to a single-layer film and can be formed as a stacked-layer film.

Note that, in order to extract light emitted from the EL layer 903 to the outside, one or both of the first electrode 902 and the second electrode 904 is/are formed to transmit light. For example, one or both of the first electrode 902 and the second electrode 904 is/are formed using a conductive material having a light-transmitting property, such as indium tin oxide, or formed using silver, aluminum, or the like to a thickness of several nanometers to several tens of nanometers. Alternatively, one or both of the first electrode 902 and the second electrode 904 can have a stacked-layer structure including a thin film of a metal such as silver or aluminum with a small thickness and a thin film of a conductive material having a light-transmitting property, such as ITO.

Note that the EL layer 903 of the light emitting element described in this embodiment (the hole injecting layer 911, the hole transporting layer 912, the light emitting layer 913, the electron transporting layer 914, or the electron injecting layer 915) can be formed by the deposition method described in Embodiment 1 or 2. In addition, the electrodes can also be formed by the deposition method described in Embodiment 1 or 2.

For example, in the case of forming the light emitting element illustrated in FIG. 10A, the material layer of the deposition donor substrate described in Embodiment 1 is formed with a material for forming the EL layer 903, and this deposition donor substrate is used to form the EL layer 903 over the first electrode 902 over the substrate 901. Then, the second electrode 904 is formed over the EL layer 903; thus, the light emitting element illustrated in FIG. 10A can be obtained.

Various kinds of materials can be used for the light emitting layer 913. For example, a fluorescent compound which exhibits fluorescence or a phosphorescent compound which exhibits phosphorescence can be used.

Examples of phosphorescent compounds that can be used for the light emitting layer 913 are given below. Examples of blue light emitting materials include the following: bis[2-(4',6'-difluorophenyl)pyridinato-N,$C^{2'}$]iridium(III)tetrakis(1-pyrazolyl)borate (abbr.: FIr6); bis[2-(4',6'-difluorophenyl)pyridinato-N,$C^{2'}$]iridium(III)picolinate (abbr.: FIrpic); bis[2-(3',5'bistrifluoromethylphenyl)pyridinato-N,$C^{2'}$]iridium(III) picolinate (abbr.: Ir($CF_3$ppy)$_2$(pic)); bis[2-(4',6'-difluorophenyl)pyridinato-N,$C^{2'}$]iridium(III)acetylacetonate (abbr.: FIr(acac)); and the like. Examples of green light emitting materials include the following: tris(2-phenylpyridinato-N,$C^{2'}$)iridium(III) (abbr.: Ir(ppy)$_3$); bis(2-phenylpyridinato-N,$C^{2'}$)iridium(III)acetylacetonate (abbr.: Ir(ppy)$_2$(acac)); bis (1,2-diphenyl-1H-benzimidazolato)iridium(III) acetylacetonate (abbr.: Ir(pbi)$_2$(acac)); bis(benzo[h]quinolinato)iridium(III)acetylacetonate (abbr.: Ir(bzq)$_2$(acac)); and the like. Examples of yellow light emitting materials include the following: bis(2,4-diphenyl-1,3-oxazolato-N,$C^{2'}$)iridium(III)acetylacetonate (abbr.: Ir(dpo)$_2$(acac)); bis[2-(4'-perfluorophenylphenyl)pyridinato]iridium(III)acetylacetonate (abbr.: Ir(p-PF-ph)$_2$(acac)); bis(2-phenylbenzothiazolato-N,$C^{2'}$)iridium(III)acetylacetonate (abbr.: Ir(bt)$_2$(acac)); and the like. Examples of orange light emitting materials include the following: tris(2-phenylquinolinato-N,$C^{2'}$)iridium(III) (abbr.: Ir(pq)$_3$); bis(2-phenylquinolinato-N,$C^{2'}$)iridium(III)acetylacetonate (abbr.: Ir(pq)$_2$(acac)); and the like. Examples of red light emitting materials include organic metal complexes, such as bis[2-(2'-benzo[4,5-α]thienyl)pyridinato-N,$C^{3'}$]iridium(III)acetylacetonate (abbr.: Ir(btp)$_2$(acac)), bis(1-phenylisoquinolinato-N,$C^{2'}$)iridium(III)acetylacetonate (abbr.: Ir(Piq)$_2$(acac)), (acetylacetonato)bis[2,3-bis(4-fluorophenyl)quinoxalinato]iridium(III) (abbr.: Ir(Fdpq)$_2$(acac)), and 2,3,7,8,12,13,17,18-octaethyl-21H,23H-porphyrin platinum(II) (abbr.: PtOEP). In addition, rare-earth metal complexes, such as tris(acetylacetonato)(monophenanthroline)terbium(III) (abbr.: Tb(acac)$_3$(Phen)), tris(1,3-diphenyl-1,3-propanedionato)(monophenanthrolinc)europium(III) (abbr.: Eu(DBM)$_3$(Phen)), and tris[1-(2-thenoyl)-3,3,3-trifluoroacetonato](monophenanthrohne)europium(III) (abbr.: Eu(TTA)$_3$(Phen)), exhibit light emission from rare-earth metal ions (electron transition between different multiplicities); thus, rare-earth metal complexes can be used as phosphorescent compounds.

Examples of fluorescent compounds that can be used for the light emitting layer 913 are given below. Examples of blue light emitting materials include the following: N,N'-bis[4-(9H-carbazol-9-yl)phenyl]-N,N'-diphenylstilbene-4,4'-diamine (abbr.: YGA2S); 4-(9H-carbazol-9-yl)-4'-(10-phenyl-9-anthryl)triphenylamine (abbr.: YGAPA); and the like. Examples of green light emitting materials include the following: N-(9,10-diphenyl-2-anthryl)-N,9-diphenyl-9H-carbazol-3-amine (abbr.: 2PCAPA); N-[9,10-bis(1,1'-biphenyl-2-yl)-2-anthryl]-N,9-diphenyl-9H-carbazol-3-amine (abbr.: 2PCABPhA); N-(9,10-diphenyl-2-anthryl)-N,N',N'-triphenyl-1,4-phenylenediamine (abbr.: 2DPAPA); N-[9,10-bis(1,1'-biphenyl-2-yl)-2-anthryl]-N,N', N'-triphenyl-1,4-phenylenediamine (abbr.: 2DPABPhA); 9,10-bis(1,1'-biphenyl-2-yl)-N-[4-(9H-carbazol-9-yl)phenyl]-N-phenylanthracen-2-amine (abbr.: 2YGABPhA); N,N,9-triphenylanthracen-9-amine (abbr.: DPhAPhA); and the like. Examples of yellow light emitting materials include the following: rubrene; 5,12-bis(1,1'-biphenyl-4-yl)-6,11-diphenyltetracene (abbr.: BPT); and the like. Examples of red light emitting materials include the following: N,N,N',N'-tetrakis(4-methylphenyl)tetracene-5,11-diamine (abbr.: p-mPhTD); 7,13-diphenyl-N,N,N',N'-tetrakis(4-methylphenyl)acenaphtho[1,2-a]fluoranthene-3,10-diamine (abbr.: p-mPhAFD); and the like.

The light emitting layer 913 may have a structure in which a substance having a high light emitting property (a dopant material) is dispersed in another substance (a host material), whereby crystallization of the light emitting layer can be suppressed. In addition, concentration quenching which results from high concentration of the substance having a high light emitting property can be suppressed.

As the substance in which the substance having a high light emitting property is dispersed, when the substance having a high light emitting property is a fluorescent compound, a substance having singlet excitation energy (the energy difference between a ground state and a singlet excited state) which is higher than that of the fluorescent compound is preferably used. When the substance having a high light emitting property is a phosphorescent compound, a substance having triplet excitation energy (the energy difference between a ground state and a triplet excited state) which is higher than that of the phosphorescent compound is preferably used.

Examples of host materials used for the light emitting layer 913 include the following: 4,4'-bis[N-(1-naphthyl)-N-phenylamino]biphenyl (abbr.: NPB); tris(8-quinolinolato)aluminum(III) (abbr.: Alq); 4,4'-bis[N-(9,9-dimethylfluoren-2-yl)-N-phenylamino]biphenyl (abbr.: DFLDPBi); bis(2-methyl-8-quinolinolato)(4-phenylphenolato)aluminum(III) (abbr.: BAlq); 4,4'-di(9-carbazolyl)biphenyl (abbr.: CBP); 2-tert-butyl-9,10-di(2-naphthyl)anthracene (abbr.: t-BuDNA); 9-[4-(9-carbazolyl)phenyl]-10-phenylanthracene (abbr.: CZPA); and the like.

As the dopant material, any of the above-mentioned phosphorescent compounds and fluorescent compounds can be used.

When the light emitting layer 913 has a structure in which a substance having a high light emitting property (a dopant material) is dispersed in another substance (a host material), a mixed layer of a host material and a guest material may be formed as a material layer over a deposition donor substrate. Alternatively, the material layer over the deposition donor substrate may have a structure in which a layer containing a host material and a layer containing a dopant material are stacked. The light emitting layer 913, when formed using a deposition donor substrate having a material layer with such a structure, contains a substance in which a light emitting material is dispersed (host material) and a substance having a high light emitting property (dopant material), and has a structure in which the substance having a high light emitting property (dopant material) is dispersed in the substance in which a light emitting material is dispersed (host material). Note that, for the light emitting layer 913, two or more kinds of host materials and a dopant material may be used, or two or more kinds of dopant materials and a host material may be used. Alternatively, two or more kinds of host materials and two or more kinds of dopant materials may be used.

In the case of forming the light emitting element illustrated in FIG. 10B, the EL layer 903 can be formed over the first electrode 902 over the substrate 901 by the method described in Embodiment 1 or 2 in such a manner that deposition donor substrates described in Embodiment 1 or 2, which each have a material layer formed with a material of one of the layers in the EL layer 903 (the hole injecting layer 911, the hole transporting layer 912, the electron transporting layer 914, and the electron injecting layer 915) are prepared for respective layers and a different deposition donor substrate is used for deposition of each layer. Then, the second electrode 904 is formed over the EL layer 903; thus, the light emitting element illustrated in FIG 10B can be obtained. Note that the method described in Embodiment 1 or 2 can be used in this case for each layer of the EL layer 903, whereas the method described in any of Embodiments 1 to 3 may be used for only some of the layers. Note that the method described in any of Embodiments 1 to 3 makes it possible to form a fine pattern, and in the case of manufacturing a full-color display device, the method is preferably used for a light emitting layer. In addition, the method described in any of Embodiments 1 to 3 is preferably used for a low-molecular organic compound.

For example, the hole injecting layer 911 can be formed using molybdenum oxide, vanadium oxide, ruthenium oxide, tungsten oxide, manganese oxide, or the like. Alternatively, the hole injecting layer can be formed using a phthalocyanine-based compound such as phthalocyanine (abbr.: $H_2Pc$) or copper phthalocyanine (abbr.: CuPc), a high molecular compound such as poly(3,4-ethylenedioxythiophene)/poly(styrenesufonate) (PEDOT/PSS), or the like.

As the hole injecting layer 911, a layer which contains a substance having a high hole transporting property and a substance having an electron accepting property can be used. The layer which contains a substance having a high hole transporting property and a substance having an electron accepting property has high carrier density and an excellent hole injecting property. When the layer which contains a substance having a high hole transporting property and a substance having an electron accepting property is used as a hole injecting layer which is in contact with an electrode that functions as an anode, any of various kinds of metals, alloys, electrically conductive compounds, mixtures thereof, and the like can be used as a material of the electrode which functions as an anode regardless of its magnitude of work function.

The layer which contains a substance having a high hole transporting property and a substance having an electron accepting property can be formed using, for example, a deposition donor substrate including a material layer where a layer which contains a substance having a high hole transporting property and a layer which contains a substance having an electron accepting property are stacked.

Examples of the substance having an electron accepting property, which is used for the hole injecting layer 911, include the following: 7,7,8,8-tetracyano-2,3,5,6-tetrafluoroquinodimethane (abbr.: $F_4$-TCNQ); chloranil; and the like. Other examples are transition metal oxides. Still other examples are oxides of metals belonging to Groups 4 to 8 of the periodic table. Specifically, vanadium oxide, niobium oxide, tantalum oxide, chromium oxide, molybdenum oxide, tungsten oxide, manganese oxide, and rhenium oxide are preferable because of their high electron-accepting properties. Among them, molybdenum oxide is especially preferable because it is stable also in the atmosphere, has a low hygroscopic property, and can be easily handled.

As the substance having a high hole transporting property used for the hole injecting layer 911, any of various compounds such as aromatic amine compounds, carbazole derivatives, aromatic hydrocarbons, and high molecular compounds (such as oligomers, dendrimers, and polymers) can be used. Note that it is preferable that the substance having a high hole transporting property used for the hole injecting layer be a substance having a hole mobility of $10^{-6}$ cm$^2$/Vs or more. Note that any other substance that has a hole transporting property which is higher than an electron transporting property may be used. Specific examples of the substance having a high hole transporting property, which can be used for the hole injecting layer 911, are given below.

Examples of aromatic amine compounds that can be used for the hole injecting layer 911 include the following: 4,4'-bis[N-(1-naphthyl)-N-phenylamino]biphenyl (abbr.: NPB); N,N'-bis(3-methylphenyl)-N,N'-diphenyl-[1,1'-biphenyl]-4,4'-diamine (abbr.: TPD); 4,4',4"-tris(N,N-diphenylamino)triphenylamine (abbr.: TDATA); 4,4',4"-tris[N-(3-methylphenyl)-N-phenylamino]triphenylamine (abbr.: MTDATA); 4,4'-bis[N-(spiro-9,9'-bifluoren-2-yl)-N-phenylamino]biphenyl (abbr.: BSPB); and the like. Other examples are as follows: N,N'-bis(4-methylphenyl)(p-tolyl)-N,N'-diphenyl-p-phenylenediamine (abbr.: DTDPPA); 4,4'-bis[N-(4-diphenylaminophenyl)-N-phenylamino]biphenyl (abbr.: DPAB); 4,4'-bis(N-{4-[N'-(3-methylphenyl)-N'-phenylamino]phenyl}-N-phenylamino)biphenyl (abbr.: DNTPD); 1,3,5-tris[N-(4-diphenylaminophenyl)-N-phenylamino]benzene (abbr.: DPA3B); and the like.

Specific examples of carbazole derivatives that can be used for the hole injecting layer 911 include the following: 3-[N-(9-phenylcarbazol-3-yl)-N-phenylamino]-9-phenylcarbazole (abbr.: PCzPCA1); 3,6-bis[N-(9-phenylcarbazol-3-yl)-N-phenylamino]-9-phenylcarbazole (abbr.: PCzPCA2); 3-[N-(1-naphthyl)-N-(9-phenylcarbazol-3-yl) amino]-9-phenylcarbazole (abbr.: PCzPCN1); and the like.

Other examples of carbazole derivatives that can be used for the hole injecting layer 911 include the following: 4,4'-di(N-carbazolyl)biphenyl (abbr.: CBP); 1,3,5-tris[4-(N-carbazolyl)phenyl]benzene (abbr.: TCPB); 9-[4-(10-phenyl-9-anthryl)phenyl]-9H-carbazole (abbr.: CZPA); 1,4-bis[4-(N-carbazolyl)phenyl]-2,3,5,6-tetraphenylbenzene; and the like.

Examples of aromatic hydrocarbons that can be used for the hole injecting layer 911 include the following: 2-tert-butyl-9,10-di(2-naphthyl)anthracene (abbr.: t-BuDNA); 2-tert-butyl-9,10-di(1-naphthyl)anthracene; 9,10-bis(3,5-diphenylphenyl)anthracene (abbr.: DPPA); 2-tert-butyl-9,10-bis(4-phenylphenyl)anthracene (abbr.: t-BuDBA); 9,10-di(2-naphthyl)anthracene (abbr.: DNA); 9,10-diphenylanthracene (abbr.: DPAnth); 2-tert-butylanthracene (abbr.: t-BuAnth); 9,10-bis(4-methyl-1-naphthyl)anthracene (abbr.: DMNA); 9,10-bis[2-(1-naphthyl)phenyl]-2-tert-butyl-anthracene; 9,10-bis[2-(1-naphthyl)phenyl]anthracene; 2,3,6,7-tetramethyl-9,10-di(1-naphthyl)anthracene; 2,3,6,7-tetramethyl-9,10-di(2-naphthyl)anthracene; 9,9'-bianthryl; 10,10'-diphenyl-9,9'-bianthryl; 10,10'-bis(2-phenylphenyl)-9,9'-bianthryl; 10,10'-bis[(2,3,4,5,6-pentaphenyl)phenyl]-9,9'-bianthryl; anthracene; tetracene; rubrene; perylene; 2,5,8,11-tetra(tert-butyl)perylene; and the like. Besides, pentacene, coronene, or the like can also be used. As these aromatic hydrocarbons listed here, it is preferable that an aromatic hydrocarbon having a hole mobility of $1 \times 10^{-6}$ cm$^2$/Vs or more and having 14 to 42 carbon atoms be used.

Note that an aromatic hydrocarbon that can be used for the hole injecting layer 911 may have a vinyl skeleton. Examples of aromatic hydrocarbons having a vinyl group include the following: 4,4'-bis(2,2-diphenylvinyl)biphenyl (abbr.: DPVBi); 9,10-bis[4-(2,2-diphenylvinyl)phenyl]anthracene (abbr.: DPVPA); and the like.

The hole injecting layer 911 can be formed by using a deposition donor substrate including a material layer where the layer which contains a substance having a high hole transporting property and the layer which contains a substance having an electron accepting property are stacked. When a metal oxide is used as the substance having an electron accepting property, it is preferable that a layer which contains a metal oxide be formed after the layer which contains a substance having a high hole transporting property be formed over a support substrate of the deposition donor substrate. This is because, in many cases, a metal oxide has a higher evaporation temperature than a substance having a high hole transporting property. The deposition donor substrate with such a structure makes it possible to efficiently deposit a substance having a high hole transporting property and a metal oxide. In addition, local nonuniformity of the concentration in a film deposited can be suppressed. Moreover, there are few kinds of solvents which allow both a substance having a high hole transporting property and a metal oxide to be dissolved or dispersed therein, and a mixed solution is not easily formed. Therefore, it is difficult to directly form a mixed layer by a wet method. However, the use of the deposition method described in the above embodiment makes it possible to easily form a mixed layer which contains a substance having a high hole transporting property and a metal oxide.

In addition, the layer which contains a substance having a high hole transporting property and a substance having an electron accepting property is excellent in not only a hole injecting property but also a hole transporting property, and thus the above-described hole injecting layer 911 may be used as the hole transporting layer.

The hole transporting layer 912 is a layer which contains a substance having a high hole transporting property. Examples of the substance having a high hole transporting property include aromatic amine compounds such as 4,4'-bis[N-(1-naphthyl)-N-phenylamino]biphenyl (abbr.: NPB or α-NPD), N,N'-bis(3-methylphenyl)-N,N'-diphenyl-[1,1'-biphenyl]-4,4'-diamine (abbr.: TPD), 4,4',4"-tris(N,N-diphenylamino)triphenylamine (abbr.: TDATA), 4,4',4"-tris[N-(3-methylphenyl)-N-phenylamino]triphenylamine (abbr.: MTDATA), and 4,4'-bis[N-(spiro-9,9'-bifluoren-2-yl)-N-phenylamino]biphenyl (abbr.: BSPB), and the like. The substances listed here mainly have a hole mobility of $1 \times 10^{-6}$ cm$^2$/Vs or more. Note that any other material that has a hole transporting property which is higher than an electron transporting property may be used. The layer which contains a substance having a high hole transporting property is not limited to a single layer and may be a stacked layer of two or more layers formed of the above-mentioned substances.

The electron transporting layer 914 is a layer which contains a substance having a high electron transporting property. Examples of the substance having a high electron transporting property include metal complexes having a quinoline skeleton or a benzoquinoline skeleton, such as tris(8-quinolinolato)aluminum (abbr.: Alq), tris(4-methyl-8-quinolinolato)aluminum (abbr.: Almq$_3$), bis(10-hydroxybenzo[h]quinolinato)beryllium (abbr.: BeBq$_2$), and bis(2-methyl-8-quinolinolato)(4-phenylphenolato)aluminum (abbr.: BAlq), and the like. Other examples are metal complexes having an oxazole-based ligand or a thiazole-based ligand, such as bis [2-(2-hydroxyphenyl)benzoxazolato]zinc (abbr.: Zn(BOX)$_2$) and bis[2-(2-hydroxyphenyl)benzothiazolato]zinc (abbr.: Zn(BTZ)$_2$), and the like. Besides metal complexes, other examples are as follows: 2-(4-biphenylyl)-5-(4-tert-butylphenyl)-1,3,4-oxadiazole (abbr.: PBD); 1,3-bis[5-(p-tert-butylphenyl)-1,3,4-oxadiazol-2-yl]benzene (abbr.: OXD-7); 3-(4-biphenylyl)-4-phenyl-5-(4-tert-butylphenyl)-1,2,4-triazole (abbr.: TAZ01); bathophenanthroline (abbr.: BPhen); bathocuproine (abbr: BCP); and the like. The substances listed here mainly have an electron mobility of $1\times10^{-6}$ cm$^2$/Vs or more. Note that any other material that has an electron transporting property which is higher than a hole transporting property may be used for the electron transporting layer. The electron transporting layer is not limited to a single layer and may be a stacked layer of two or more layers formed of the above-mentioned substances.

The electron injecting layer 915 can be formed using an alkali metal compound or an alkaline earth metal compound, such as lithium fluoride (LiF), cesium fluoride (CsF), or calcium fluoride (CaF$_2$). Furthermore, a layer in which a substance having an electron transporting property is combined with an alkali metal or an alkaline earth metal can be employed. For example, a layer of Alq containing magnesium (Mg) can be used. Note that it is preferable that the layer in which a substance having an electron transporting property is combined with an alkali metal or an alkaline earth metal be used as the electron injecting layer because electrons are efficiently injected from the second electrode 904.

Note that there is no particular limitation on the stack structure of layers of the EL layer 903. The EL layer 903 may be formed with an appropriate combination of a light emitting layer with any of layers which contain a substance having a high electron transporting property, a substance having a high hole transporting property, a substance having a high electron injecting property, a substance having a high hole injecting property, a bipolar substance (a substance having high electron and hole transporting properties), and the like.

Light emission obtained in the EL layer 903 is extracted to the outside through one or both of the first electrode 902 and the second electrode 904. Therefore, one or both of the first electrode 902 and the second electrode 904 is/are an electrode having a light transmitting property. In the case where only the first electrode 902 is an electrode having a light transmitting property, light is extracted from the substrate 901 side through the first electrode 902. In the case where only the second electrode 904 is an electrode having a light transmitting property, light is extracted from the side opposite to the substrate 901 side through the second electrode 904. In the case where both the first electrode 902 and the second electrode 904 are electrodes having light transmitting properties, light is extracted from both the substrate 901 side and the side opposite to the substrate 901 side through the first electrode 902 and the second electrode 904.

Note that although FIGS. 10A and 10B each illustrate a structure in which the first electrode 902 functioning as an anode is provided on the substrate 901 side, the second electrode 904 functioning as a cathode may be provided on the substrate 901 side.

The EL layer 903 may be formed by the deposition method described in Embodiment 1 or 2 in combination with another deposition method. Each electrode or each layer may be formed by a different method. Examples of dry methods include a vacuum evaporation method, an electron beam evaporation method, a sputtering method, and the like. Examples of wet methods include a spin coating method, a spray coating method, an inkjet method, a dip coating method, a casting method, a die coating method, a roll coating method, a blade coating method, a bar coating method, a gravure coating method, a printing method, and the like.

In a light emitting element according to this embodiment, an EL layer can be formed by application of the deposition method described in the above embodiment. Thus, an EL layer included in a light emitting element can be easily formed, and a light emitting device including a light emitting element can be easily manufactured.

By application of the deposition method described in the above embodiment, it becomes possible to deposit a flat and uniform film. Thus, a light emitting device with excellent performance can be manufactured with high productivity.

By application of the deposition method described in the above embodiment, it becomes possible to form a fine pattern and to suppress blur where deposition is also performed to a region outside a desired pattern. Thus, a high-definition light emitting device can be manufactured.

In the deposition method described in the above embodiment, unlike in the case of forming an EL layer by a wet method, there is no need to consider solubility or the like of a previously formed layer; thus, there is a wider choice of kinds of deposition materials. In addition, the number of layers stacked can be freely set. Thus, a light emitting device with a desired stacked-layer structure can be formed using desired materials.

By application of the deposition method described in the above embodiment, attachment of a material to the inner wall of a deposition chamber can be prevented, which allows maintenance of a deposition apparatus to be simplified.

In the deposition method described in the above embodiment, a high-power laser can be used as a light source; thus, deposition can be performed over a large area at a time. Accordingly, the time it takes to manufacture a light emitting device (the cycle time) can be shortened, and productivity can be improved.

In the deposition method described in the above embodiment, by the control of the thickness of a material layer formed on a deposition donor substrate, the thickness of a film to be deposited to a deposition target substrate can be controlled. Thus, a thickness monitor is not necessary when deposition is performed onto the deposition target substrate. Therefore, a practitioner does not have to adjust deposition rate using a thickness monitor, and the deposition step can be fully automated. Accordingly, productivity can be improved.

A material included in a material layer formed on a deposition donor substrate can be uniformly deposited. Even in the case where a material layer includes a plurality of materials, a film including the same materials as the material layer at approximately the same weight ratio can be deposited onto a deposition target substrate. Accordingly, by the deposition method according to this embodiment, even in the case of deposition of a plurality of materials which vaporize at different temperatures, a layer including desired different materials can be deposited easily and accurately without any complicated control of evaporation rate or the like.

Note that the structure of this embodiment can be appropriately used in combination with a structure described in another embodiment.

(Embodiment 6)

In this embodiment, a light emitting device which is formed using the light emitting element described in Embodiment 5 is described.

First, an example of a passive-matrix light emitting device is described with reference to FIGS. 11A to 11C and FIG. 12.

In a passive-matrix (also referred to as simple-matrix) light emitting device, a plurality of anodes arranged in stripes (in strip form) are provided to be perpendicular to a plurality of cathodes arranged in stripes. A light emitting layer is interposed at each intersection. Therefore, a pixel at an intersection of an anode selected (to which a voltage is applied) and a cathode selected emits light.

FIG. 11A illustrates a top view of a pixel portion before sealing. FIG. 11B illustrates a cross-sectional view taken along a dashed line A-A' in FIG. 11A. FIG 11C illustrates a cross-sectional view taken along a dashed line B-B'.

Over a substrate 1001, an insulating layer 1004 is formed as a base insulating layer. Note that the insulating layer 1004 does not necessarily need to be formed if a base insulating layer is not necessary. A plurality of first electrodes 1013 are arranged in stripes at regular intervals over the insulating layer 1004. A partition 1014 having openings each corresponding to a pixel is provided over the first electrodes 1013. The partition 1014 having openings is formed using an insulating material (a photosensitive or nonphotosensitive organic material (polyimide, acrylic, polyamide, polyimide amide, or benzocyclobutene) or an SOG film (such as a $SiO_x$ film including an alkyl group)). Note that each opening corresponding to a pixel is a light emitting region 1021.

Over the partition 1014 having openings, a plurality of inversely tapered partitions 1022 parallel to each other are provided to intersect with the first electrodes 1013. The inversely tapered partitions 1022 are formed by a photolithography method using a positive-type photosensitive resin, of which portion unexposed to light remains as a pattern, and by adjusting the amount of light exposure or the length of development time so that a lower portion of a pattern is etched more.

The total thickness of the partition 1014 having openings and the inversely tapered partition 1022 is set to be larger than the total thickness of an EL layer and a second electrode 1016. In this manner, EL layers, specifically, EL layers (R) (1015R) formed with a material exhibiting red light emission, EL layers (G) (1015G) formed with a material exhibiting green light emission, and EL layers (B) (1015B) formed with a material exhibiting blue light emission, and second electrodes 1016, which are separated into a plurality of regions, are formed. Note that the plurality of separated regions are electrically isolated from each other.

The second electrodes 1016 are electrodes in stripes which are parallel to each other and extended along a direction intersecting with the first electrodes 1013. Note that part of the EL layers and a conductive layer for forming the second electrodes 1016 are formed over the inversely tapered partitions 1022; however, these are separated from the EL layers (R) (1015R), the EL layers (G) (1015G), the EL layers (B) (1015B), and the second electrodes 1016. Note that the EL layer in this embodiment is a layer including at least a light emitting layer and may include a hole injecting layer, a hole transporting layer, an electron transporting layer, an electron injecting layer, or the like in addition to the light emitting layer In this embodiment, an example is described in which the EL layers (R) (1015R), the EL layers (G) (1015G), and the EL layers (B) (1015B) are selectively formed to form a light emitting device capable of full-color display which provides three kinds of light emission (red (R), green (G), and blue (B)). Note that the EL layers (R) (1015R), the EL layers (G) (1015G), and the EL layers (B) (1015B) are formed in a pattern of stripes parallel to each other. These EL layers may be formed by the deposition method described in Embodiment 1 or 2.

Furthermore, if necessary, scaling is performed using a sealant such as a sealant can or a glass substrate for sealing. In this embodiment, a glass substrate is used as a sealing substrate, and a substrate and the sealing substrate are attached to each other with an adhesive material such as a sealing material to seal a space surrounded by the adhesive material such as a sealing material. The space that is sealed is filled with a filler or a dry inert gas. In addition, a desiccant or the like may be put between the substrate and the sealing material so that reliability of the light emitting device is increased. A small amount of moisture is removed by the desiccant, whereby sufficient drying is performed. The desiccant may be a substance which absorbs moisture by chemical adsorption, such as an oxide of an alkaline earth metal as typified by calcium oxide or barium oxide. A substance which adsorbs moisture by physical adsorption, such as zeolite or silica gel, may alternatively be used.

Note that if the sealant is provided to cover and to be in contact with the light emitting element and the outside air is sufficiently blocked, the desiccant is not necessarily provided.

Figure 12:
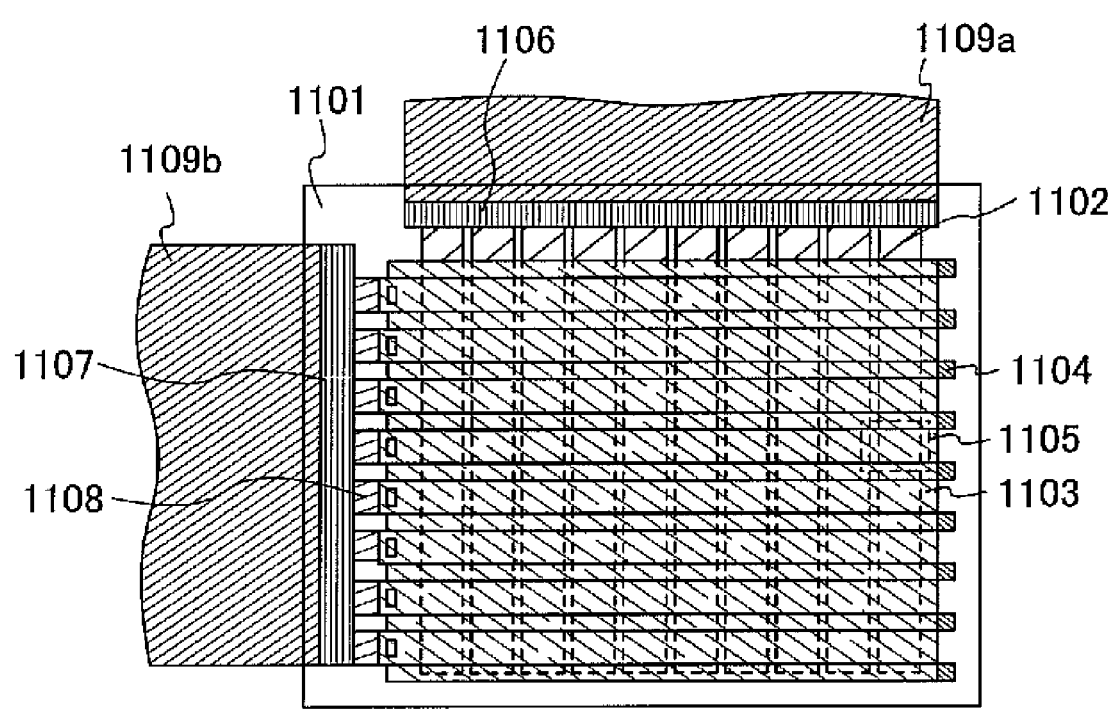
FIG. 12 is a diagram illustrating a passive-matrix light emitting device.

Next, FIG. 12 illustrates a top view of the passive-matrix light emitting device illustrated in FIGS. 11A to 11C and mounted with an FPC or the like.

In FIG. 12, in a pixel portion for displaying images, scan lines and data lines perpendicularly intersect with each other.

In this embodiment, the first electrodes 1013 in FIGS. 11A to 11C correspond to scan lines 1103 in FIG. 12; the second electrodes 1016 correspond to data lines 1102; and the inversely tapered partitions 1022 correspond to partitions 1104; and the substrate 1001 corresponds to a substrate 1101. EL layers are sandwiched between the data lines 1102 and the scan lines 1103, and an intersection portion indicated as a region 1105 corresponds to one pixel.

Note that the scan lines 1103 are electrically connected at their ends to connection wirings 1108, and the connection wirings 1108 are connected to an FPC 1109b through an input terminal 1107. The data lines 1102 are connected to an FPC 1109a through an input terminal 1106.

If necessary, a polarizing plate, a circularly polarizing plate (including an elliptically polarizing plate), a retardation plate (a quarter-wave plate or a half-wave plate), or an optical film such as a color filter may be appropriately provided over a light emitting surface. Further, the polarizing plate or the circularly polarizing plate may be provided with an anti-reflection film. For example, anti-glare treatment maybe carried out by which reflected light can be diffused by projections and depressions on the surface so as to reduce glare.

Although FIG. 12 illustrates the example in which a driver circuit is not provided over the substrate, this embodiment is not particularly limited to this example and an IC chip including a driver circuit may be mounted on the substrate.

In the case where an IC chip is mounted, a data line side IC and a scan line side IC, in each of which a driver circuit for transmitting a signal to the pixel portion is formed, are mounted on the periphery of (outside of) the pixel portion by a COG method. The mounting may be performed using TCP or a wire bonding method instead of the COG method. TCP is a TAB tape mounted with an IC, and the TAB tape is connected to a wiring over an element-forming substrate, thereby mounting the IC. Each of the data line side IC and the scan line side IC may be formed using a silicon substrate. Alternatively, it may be that in which a driver circuit is formed using TFTs over a glass substrate, a quartz substrate, or a plastic substrate. Although described here is an example in which a single IC is provided on one side, a plurality of ICs may be provided on one side.

Next, an example of an active-matrix light emitting device is described with reference to FIGS. 13A and 13B. Note that FIG. 13A is a top view illustrating a light emitting device and FIG. 13B is a cross-sectional view taken along a chain line A-A' in FIG. 13A. The active-matrix light emitting device of this embodiment includes a pixel portion 1202 provided over an element substrate 1210, a driver circuit portion (a source side driver circuit) 1201, and a driver circuit portion (a gate side driver circuit) 1203. The pixel portion 1202, the driver circuit portion 1201, and the driver circuit portion 1203 are sealed, with a sealant 1205, between the element substrate 1210 and a sealing substrate 1204.

In addition, over the element substrate 1210, a lead wiring 1208 for connecting an external input terminal, through which a signal (e.g., a video signal, a clock signal, a start signal, a reset signal, or the like) or an electric potential is transmitted to the driver circuit portion 1201 and the driver circuit portion 1203, is provided. In this embodiment, an example is described in which a flexible printed circuit (FPC) 1209 is provided as the external input terminal. Note that only the FPC is illustrated here; however, the FPC may be provided with a printed wiring board (PWB). The light emitting device in this specification includes not only the main body of the light emitting device but also the light emitting device with an FPC or a PWB attached thereto.

Next, a cross-sectional structure is described with reference to FIG. 13B. The driver circuit portions and the pixel portion are formed over the element substrate 1210; however, the pixel portion 1202 and the driver circuit portion 1201 which is the source side driver circuit are illustrated in FIG. 13B.

An example is given here in which a CMOS circuit which is a combination of an n-channel TFT 1223 and a p-channel TFT 1224 is formed in the driver circuit portion 1201. Note that a circuit included in the driver circuit portion may be formed using various CMOS circuits, PMOS circuits, or NMOS circuits. In this embodiment, a driver-integrated type in which a driver circuit is formed over a substrate where a pixel portion is formed is described; however, this structure is not necessarily required, and a driver circuit can be formed not on but outside the substrate where the pixel portion is formed.

The pixel portion 1202 includes a plurality of pixels, each of which includes a switching TFT 1211, a current-controlling TFT 1212, and a first electrode 1213 which is electrically connected to a wiring (a source electrode or a drain electrode) of the current-controlling TFT 1212. Note that an insulator 1214 is formed to cover an end portion of the first electrode 1213. In this embodiment, the insulator 1214 is formed using a positive-type photosensitive acrylic resin.

The insulator 1214 is preferably formed so as to have a curved surface with curvature at an upper end portion or a lower end portion thereof in order to obtain favorable coverage by a film which is to be stacked over the insulator 1214. For example, in the case of using a positive-type photosensitive acrylic resin as a material for the insulator 1214, the insulator 1214 is preferably formed to have a curved surface with a curvature radius (0.2 μm to 3 μm) at the upper end portion thereof. Either a negative-type photosensitive material which becomes insoluble in an etchant by light irradiation or a positive-type photosensitive material which becomes soluble in an etchant by light irradiation can be used for the insulator 1214. As the insulator 1214, without limitation to an organic compound, either an organic compound or an inorganic compound such as silicon oxide or silicon oxynitride can be used.

An EL layer 1200 and a second electrode 1216 are stacked over the first electrode 1213. Note that when an ITO film is used as the first electrode 1213, and a stacked film of a titanium nitride film and a film containing aluminum as its main component or a stacked film of a titanium nitride film, a film containing aluminum as its main component, and a titanium nitride film is used as the wiring of the current-controlling TFT 1212 which is connected to the first electrode 1213, resistance of the wiring is low and favorable ohmic contact with the ITO film can be obtained. Note that although not illustrated in FIGS. 13A and 13B, the second electrode 1216 is electrically connected to the FPC 1209 which is an external input terminal.

In the EL layer 1200, at least a light emitting layer is provided, and in addition to the light emitting layer, a hole injecting layer, a hole transporting layer, an electron transporting layer, or an electron injecting layer is provided as appropriate. The first electrode 1213, the EL layer 1200, and the second electrode 1216 are stacked, whereby a light emitting element 1215 is formed.

Although the cross-sectional view of FIG. 13B illustrates only one light emitting element 1215, a plurality of light emitting elements are arranged in matrix in the pixel portion 1202. Light emitting elements which provide three kinds of light emission (R, Q and B) are selectively formed in the pixel portion 1202, whereby a light emitting device capable of full-color display can be formed. Alternatively, by a combination with a color filter, a light emitting device capable of full-color display may be formed.

Furthermore, the sealing substrate 1204 and the element substrate 1210 are attached to each other with the sealant 1205, whereby the light emitting element 1215 is provided in a space 1207 surrounded by the element substrate 1210, the sealing substrate 1204, and the sealant 1205. Note that the space 1207 may be filled with the sealant 1205 or with an inert gas (such as nitrogen or argon).

Note that an epoxy-based resin is preferably used as the sealant 1205. It is preferable that such a material transmit as little moisture and oxygen as possible. As the sealing substrate 1204, a plastic substrate formed of fiberglass-reinforced plastics (FRP), polyvinyl fluoride (PVF), polyester, acrylic, or the like can be used instead of a glass substrate or a quartz substrate.

As described above, the light emitting device of this embodiment can be obtained. An active-matrix light emitting device tends to require higher manufacturing cost per device than a passive-matrix light emitting device because TFTs are manufactured; however, the deposition method described in the above embodiment makes it possible to reduce manufacturing cost of a light emitting device.

By application of the deposition method described in the above embodiment, an EL layer included in a light emitting element can be easily formed, and a light emitting device including a light emitting element can be easily manufactured.

By application of the deposition method described in the above embodiment, it becomes possible to deposit a flat and uniform film. Thus, a light emitting device with excellent performance can be manufactured with high productivity.

By application of the deposition method described in the above embodiment, it becomes possible to form a fine pattern and to suppress blur where deposition is also performed to a region outside a desired pattern. Thus, a high-definition light emitting device can be manufactured.

In the deposition method described in the above embodiment, unlike in the case of forming an EL layer by a wet method, there is no need to consider solubility or the like of a previously formed layer; thus, there is a wider choice of kinds of deposition materials. In addition, the number of layers stacked can be freely set. Thus, a light emitting device with a desired stacked-layer structure can be manufactured using desired materials.

By application of the deposition method described in the above embodiment, a desired material can be deposited to a deposition target substrate without being wasted. Thus, material use efficiency can be improved and manufacturing cost can be decreased. In addition, attachment of a material to the inner wall of a deposition chamber can be prevented, which allows maintenance of a deposition apparatus to be simplified.

In the deposition method described in the above embodiment, a high-power laser can be used as a light source; thus, deposition can be performed over a large area at a time. Accordingly, the time it takes to manufacture a light emitting device (the cycle time) can be shortened, and productivity can be improved.

In the deposition method described in the above embodiment, by the control of the thickness of a material layer formed on a deposition donor substrate, the thickness of a film to be deposited onto a deposition target substrate can be controlled. Thus, a thickness monitor is not necessary when deposition is performed onto the deposition target substrate. Therefore, a practitioner does not have to adjust deposition rate using a thickness monitor, and the deposition step can be fully automated. Accordingly, productivity can be improved.

By application of the deposition method described in the above embodiment, a material included in a material layer formed on a deposition donor substrate can be uniformly deposited onto a deposition target substrate. Even in the case where a material layer on a deposition donor substrate includes a plurality of materials, a film including the same materials as the material layer at approximately the same weight ratio can be deposited onto the deposition target substrate. Accordingly, by this deposition method, even in the case of deposition of a plurality of materials which vaporize at different temperatures, a layer including desired different materials can be deposited easily and accurately without any complicated control of evaporation rate or the like.

Note that the structure of this embodiment can be appropriately used in combination with a structure described in another embodiment.

(Embodiment 7)

In this embodiment, various electronic devices, each of which is completed using the light emitting device described in Embodiment 6, are described with reference to FIGS. 14A to 14E.

Examples of electronic devices in accordance with this embodiment include a television, a camera such as a video camera or a digital camera, a goggle type display (head mounted display), a navigation system, an audio reproducing device (such as a car audio and an audio component), a notebook computer, a game machine, a portable information terminal (such as a mobile computer, a cellular phone, a portable game machine, and an electronic book), an image reproducing device provided with a recording medium (specifically, a device for reproducing a recording medium such as a digital video disc (DVD) and having a display device for displaying the reproduced image), a lighting device, and the like. Specific examples of these electronic devices are shown in FIGS. 14A to 14E.

Figure 14A:
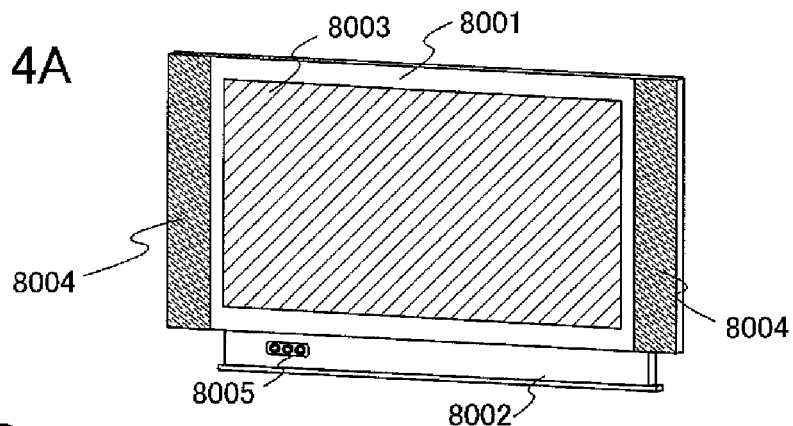
FIGS. 14A to 14E are diagrams each illustrating an example of an electronic device.

FIG. 14A illustrates a display device, which includes a chassis 8001, a support 8002, a display portion 8003, a speaker portion 8004, a video input terminal 8005, and the like. The display device is manufactured using the light emitting device which is formed in accordance with the above embodiment in the display portion 8003. Note that the display device includes display devices for a personal computer, for receiving TV broadcastings, and the like. Optical energy use efficiency is improved in a deposition process of the light emitting device that is used in the display portion of the display device; thus, deposition can be performed over a large area at a time, which is favorable for mass production of a light emitting device and an increase in area of a display portion. In addition, because manufacture efficiency and the performance of a light emitting device can be improved, manufacturing cost in manufacturing the display device can be reduced and the productivity can be improved. Accordingly, an inexpensive display device can be provided.

Figure 14B:
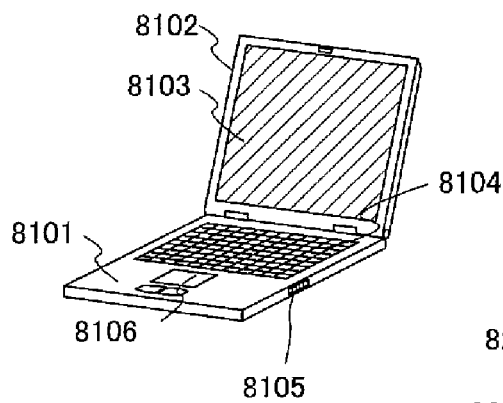

FIG. 14B illustrates a computer, which includes a main body 8101, a chassis 8102, a display portion 8103, a keyboard 8104, an external connecting port 8105, a pointing device 8106, and the like. Note that the computer is manufactured using the light emitting device which is formed in accordance with the above embodiment in the display portion 8103. In accordance with the above embodiment, the material use efficiency mainly in a deposition process of a light emitting device, the manufacture efficiency, and the performance of a light emitting device can be improved. Thus, manufacturing cost in manufacturing the computer can be reduced and the productivity can be improved. Accordingly, an inexpensive computer can be provided. In addition, optical energy use efficiency is improved in a deposition process of the light emitting device that is used in the display portion; thus, deposition can be performed over a large area at a time, which is favorable for mass production of a light emitting device and an increase in area of a display portion.

Figure 14C:
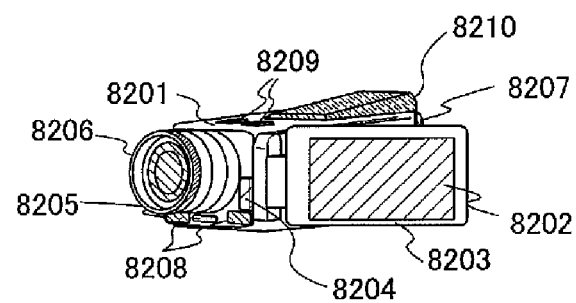

FIG. 14C illustrates a video camera, which includes a main body 8201, a display portion 8202, a chassis 8203, an external connecting port 8204, a remote control receiving portion 8205, an image receiving portion 8206, a battery 8207, an audio input portion 8208, an operation key 8209, an eyepiece portion 8210, and the like. Note that the video camera is manufactured using the light emitting device which is formed in accordance with the above embodiment in the display portion 8202. In accordance with the above embodiment, the material use efficiency mainly in a deposition process of a light emitting device, the manufacture efficiency, and the performance of a light emitting device can be improved. Thus, manufacturing cost in manufacturing the video camera can be reduced and the productivity can be improved. Accordingly, an inexpensive video camera can be provided. In addition, optical energy use efficiency is improved in a deposition process of the light emitting device that is used in the display portion; thus, deposition can be performed over a large area at a time, which is favorable for mass production of a light emitting device and an increase in area of a display portion.

Figure 14D:
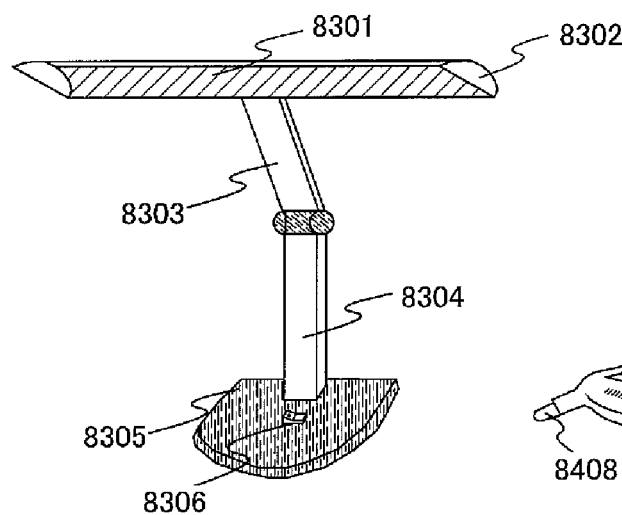

FIG. 14D illustrates a desk lamp, which includes a lighting portion 8301, a shade 8302, an adjustable arm 8303, a support 8304, a base 8305, and a power switch 8306. The desk lamp is manufactured using the light emitting device which is formed in accordance with the above embodiment in the lighting portion 8301. Note that lamps include ceiling lights, wall lights, and the like in their category. In accordance with the above embodiment, the material use efficiency mainly in a deposition process of a light emitting device, the manufacture efficiency, and the performance of a light emitting device can be improved. Thus, manufacturing cost in manufacturing the desk lamp can be reduced and the productivity can be improved. Accordingly, an inexpensive desk lamp can be provided. In addition, optical energy use efficiency is improved in a deposition process of the light emitting device that is used in the lighting portion; thus, deposition can be performed over a large area at a time, which is favorable for mass production of a light emitting device and an increase in area of a lighting portion.

Figure 14E:
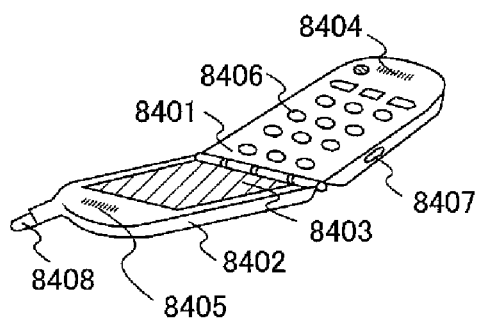

FIG. 14E illustrates a cellular phone, which includes a main body 8401, a chassis 8402, a display portion 8403, an audio input portion 8404, an audio output portion 8405, an operation key 8406, an external connecting port 8407, an antenna 8408, and the like. The cellular phone is manufactured using the light emitting device which is formed in accordance with the above embodiment in the display portion 8403. In accordance with the above embodiment, the material use efficiency mainly in a deposition process of a light emitting device, the manufacture efficiency, and the performance of a light emitting device can be improved. Thus, manufacturing cost in manufacturing the cellular phone can be reduced and the productivity can be improved. Accordingly, an inexpensive cellular phone can be provided. In addition, optical energy use efficiency is improved in a deposition process of the light emitting device that is used in the display portion; thus, deposition can be performed over a large area at a time, which is favorable for mass production of a light emitting device.

Figure 15A:
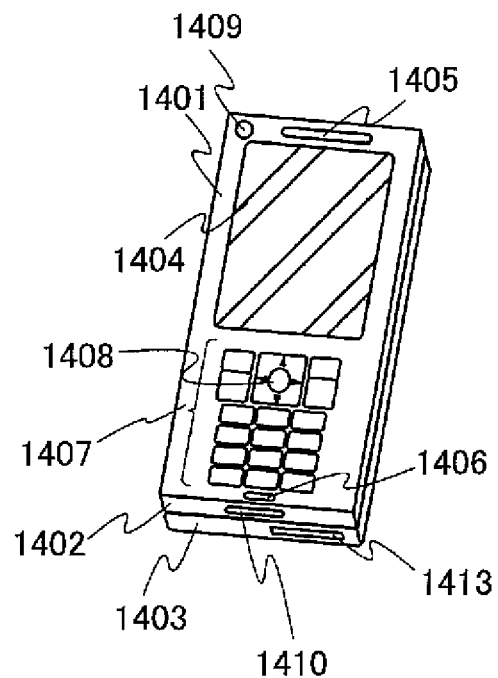
FIGS. 15A to 15C are diagrams illustrating an example of an electronic device.
Figure 15B:
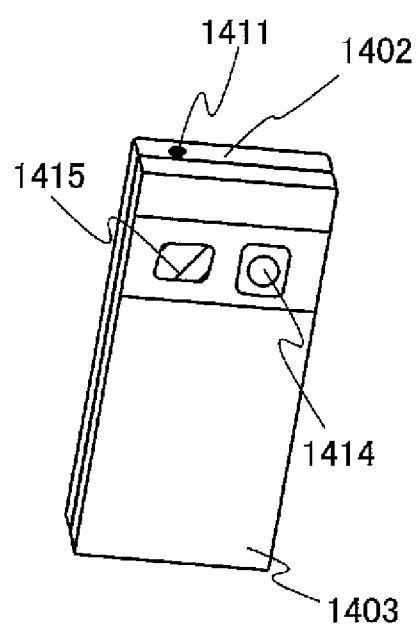

FIG. 15A also illustrates a cellular phone. FIG. 15A illustrates a front view; FIG. 15B, a rear view; and FIG. 15C, a development view. A main body 1401 is a so-called smartphone which has both a function as a telephone and a function as a portable information terminal and incorporates a computer with which a variety of data processing besides voice calls can be conducted.

The main body 1401 has two housings, a housing 1402 and a housing 1403. The housing 1402 includes a display portion 1404, a speaker 1405, a microphone 1406, operation keys 1407, a pointing device 1408, a camera lens 1409, an external connection terminal 1410, an earphone terminal 1411, and the like. The housing 1403 includes a keyboard 1412, an external memory slot 1413, a camera lens 1414, a light 1415, and the like. In addition, an antenna is incorporated in the housing 1402.

Further, in addition to the above components, the main body 1401 may incorporate a contactless IC chip, a small size memory device, or the like.

The display portion 1404, in which the display device described in the above embodiment can be incorporated, changes the direction of display as appropriate depending on a use mode. Because the camera lens 1409 is provided in the same plane as the display portion 1404, the cellular phone can be used as a videophone. Still images and moving images can be taken with the camera lens 1414 and the light 1415 by using the display portion 1404 as a viewfinder. The speaker 1405 and the microphone 1406 can be used for operations such as video calls, sound recording, and playback without being limited to the voice call function.

Figure 15C:
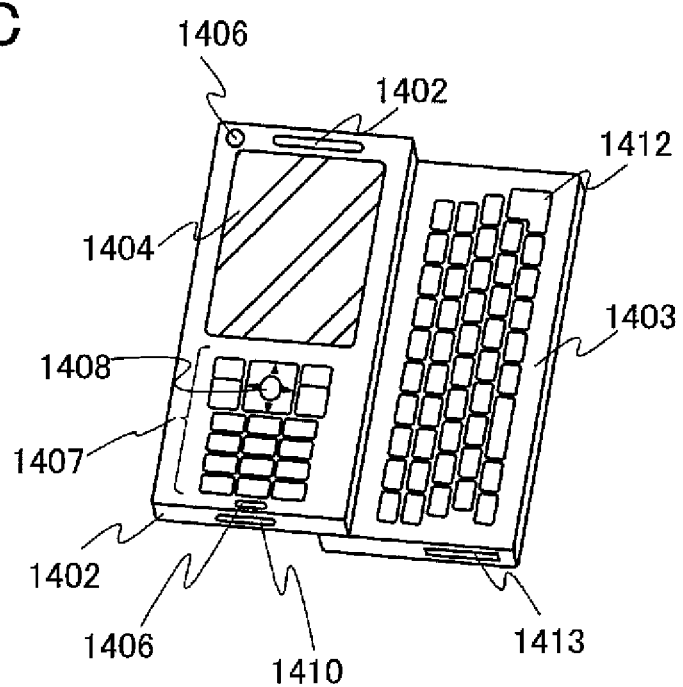

With the operation keys 1407, operation of incoming and outgoing calls, simple information input for electronic mail or the like, scrolling of a screen, cursor motion, and the like are possible. Further, the housings 1402 and 1403 which are put together to be lapped with each other (FIG. 15A) are developed by sliding as illustrated in FIG. 15C. In the developed state, the cellular phone can be used as a portable information terminal. In this state, smooth operation can be conducted using the keyboard 1412 or the pointing device 1408. The external connection terminal 1410 can be connected to an AC adaptor and various types of cables such as a USB cable, and charging and data communication with a personal computer or the like are possible. Moreover, a recording medium can be inserted into the external memory slot 1413 so that a large volume of data can be stored and can be moved.

Furthermore, in addition to the above-described functions, the cellular phone may also have an infrared communication function, a television reception function, or the like.

The aforementioned cellular phone is manufactured using the light emitting device which is formed in accordance with the above embodiment in the display portion 1404. In accordance with the above embodiment, the material use efficiency mainly in a deposition process of a light emitting device, the manufacture efficiency, and the performance of a light emitting device can be improved. Thus, manufacturing cost in manufacturing the cellular phone can be reduced and the productivity can be improved. Accordingly, an inexpensive cellular phone can be provided.

In the manner described above, electronic devices and lighting devices according to this embodiment can be obtained. This embodiment has a wide application range and can be applied to electronic devices of any fields.

Note that the structure of this embodiment can be appropriately used in combination with a structure described in another embodiment.

This application is based on Japanese Patent Application serial no. 2008-123204 filed with Japan Patent Office on May 9, 2008, the entire contents of which are hereby incorporated by reference.

What is claimed is:

1. A deposition method comprising:
   forming a lens array on one surface of a support substrate and a light absorption layer on the other opposite surface;
   forming a material layer in contact with the light absorption layer;
   disposing the surface of the support substrate on which the material layer is formed and a deposition target surface of a deposition target substrate to face each other; and
   selectively irradiating at least part of the light absorption layer with light from a side of the support substrate, on which the lens array is provided, to heat and sublime a part of the material layer overlapping with a region of the light absorption layer irradiated with the light, thereby depositing the part of the material layer on the deposition target surface,
   wherein the material layer is formed from an organic compound.

2. A deposition method according to claim 1, wherein the material layer is formed in an island or stripe shape.

3. A deposition method according to claim 1, wherein the light absorption layer is formed in an island or stripe shape.

4. A deposition method according to claim 2, wherein the light absorption layer is formed in an island or stripe shape.

5. A deposition method according to claim 1, wherein the light absorption layer has a thickness of 10 nm to 600 nm.

6. A deposition method according to claim 2, wherein the light absorption layer has a thickness of 10 nm to 600 nm.

7. A deposition method according to claim 3, wherein the light absorption layer has a thickness of 10 nm to 600 nm.

8. A deposition method comprising:
   forming a lens array on one surface of a support substrate and a light absorption layer on the other opposite surface;
   forming a material layer in contact with the light absorption layer;
   disposing a slit in a position to face the surface of the support substrate on which the lens array is formed;
   disposing the surface of the support substrate on which the material layer is formed and a deposition target surface of a deposition target substrate to face each other; and
   selectively irradiating at least part of the light absorption layer with light passing through the slit from a side of the support substrate, on which the lens array is provided, to heat and sublime a part of the material layer overlapping with a region of the light absorption layer irradiated with the light, thereby depositing the part of the material layer on the deposition target surface, wherein the material layer is formed from an organic compound.

9. A deposition method according to claim 8, further comprising:

disposing a light focusing lens array on an optical path of the light and in front of the slit; and irradiating the light absorption layer with light passing through the light focusing lens array and the slit from a side of the support substrate on which the lens array is provided.

10. A deposition method according to claim 8, wherein the material layer is formed in an island or stripe shape.

11. A deposition method according to claim 9, wherein the material layer is formed in an island or stripe shape.

12. A deposition method according to claim 8, wherein the light absorption layer is formed in an island or stripe shape.

13. A deposition method according to claim 11, wherein the light absorption layer is formed in an island or stripe shape.

14. A deposition method according to claim 8, wherein the light absorption layer has a thickness of 10 nm to 600 nm.

15. A deposition method according to claim 9, wherein the light absorption layer has a thickness of 10 nm to 600 nm.

16. A deposition method according to claim 11, wherein the light absorption layer has a thickness of 10 nm to 600 nm.

* * * * *

UNITED STATES PATENT AND TRADEMARK OFFICE
CERTIFICATE OF CORRECTION

PATENT NO. : 8,405,909 B2
APPLICATION NO. : 12/431264
DATED : March 26, 2013
INVENTOR(S) : Koichiro Tanaka It is certified that error appears in the above-identified patent and that said Letters Patent is hereby corrected as shown below:

In the Specification

Column 8, line 63, replace "YAC" with --YAG--;

Column 8, line 65, replace "YAQY$_2$O$_3$" with --YAG, Y$_2$O$_3$--;

Column 22, line 63, replace "vanous" with --various--;

Column 24, line 23, replace "filly" with --fully--;

Column 26, line 47, replace "Ir(Piq)$_2$(acac)" with --Ir(piq)$_2$(acac)--;

Column 26, line 54, replace "monophenanthrolinc" with --monophenanthroline--;

Column 26, line 56, replace "monophenanthrohne" with --monophenanthroline--;

Column 27, line 44, replace "CZPA" with --CzPA--;

Column 29, line 41, replace "CZPA" with --CzPA--;

Column 29, line 55, replace "anthracenc" with --anthracene--;

Column 33, line 64, replace "scaling" with --sealing--;

Column 36, line 20, replace "(R, Q and B)" with --(R, G and B)--.

Signed and Sealed this
Twenty-second Day of October, 2013

Teresa Stanek Rea
*Deputy Director of the United States Patent and Trademark Office*